US011177196B2

(12) United States Patent
Tabira et al.

(10) Patent No.: US 11,177,196 B2
(45) Date of Patent: Nov. 16, 2021

(54) LEAD FRAME, SEMICONDUCTOR DEVICE, AND METHOD FOR MANUFACTURING SEMICONDUCTOR DEVICE

(71) Applicant: FUJI ELECTRIC CO., LTD., Kawasaki (JP)

(72) Inventors: Keisuke Tabira, Matsumoto (JP); Kenpei Nakamura, Matsumoto (JP); Mitsuaki Matsuse, Toyama (JP); Hiroaki Furihata, Azumino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 154 days.

(21) Appl. No.: 16/582,139

(22) Filed: Sep. 25, 2019

(65) Prior Publication Data

US 2020/0161227 A1    May 21, 2020

(30) Foreign Application Priority Data

Nov. 16, 2018    (JP) .............................. JP2018-215433

(51) Int. Cl.
*H01L 23/495*    (2006.01)
*H01L 23/31*    (2006.01)
*H01L 23/00*    (2006.01)

(52) U.S. Cl.
CPC .... *H01L 23/49562* (2013.01); *H01L 23/3107* (2013.01); *H01L 23/4951* (2013.01); *H01L 23/4952* (2013.01); *H01L 24/49* (2013.01); *H01L 2224/48247* (2013.01); *H01L 2924/181* (2013.01)

(58) Field of Classification Search
USPC ......................................................... 257/666
See application file for complete search history.

(56) References Cited

U.S. PATENT DOCUMENTS

| | | | |
|---|---|---|---|
| 2001/0019856 A1* | 9/2001 | Takahashi | ............... H01L 24/97 438/127 |
| 2010/0123240 A1 | 5/2010 | Sato et al. | |
| 2011/0121440 A1 | 5/2011 | Fujiwara et al. | |
| 2017/0213782 A1 | 7/2017 | Iwai | |

(Continued)

FOREIGN PATENT DOCUMENTS

| | | |
|---|---|---|
| JP | 10-303350 A | 11/1998 |
| JP | 2000-49184 A | 2/2000 |
| JP | 2010-123686 A | 6/2010 |

(Continued)

*Primary Examiner* — Nduka E Ojeh

(57) ABSTRACT

A lead frame is provided with a die pad portion, a first lead portion, a second lead portion, and an extension portion extending from a corner portion neighborhood of the die pad portion to the outside of the die pad portion. The first lead portion has a first terminal portion and a first lead post portion positioned on a side closer to the die pad portion relative to the first terminal portion and electrically connected to the first terminal portion. The second lead portion has a second terminal portion, a third terminal portion positioned between the first terminal portion and the second terminal portion, and a second lead post portion positioned on a side closer to the die pad portion relative to the second terminal portion and the third terminal portion and electrically connected to the second terminal portion and the third terminal portion.

16 Claims, 11 Drawing Sheets

(56) References Cited

U.S. PATENT DOCUMENTS

2020/0350235 A1* 11/2020 Michikoshi ....... H01L 23/49562
2021/0098346 A1* 4/2021 Okuyama ......... H01L 23/49541

FOREIGN PATENT DOCUMENTS

| JP | 2010-258289 A | 11/2010 |
| JP | 2011-129875 A | 6/2011 |
| JP | 2016-134492 A | 7/2016 |
| JP | 2017-135241 A | 8/2017 |

* cited by examiner

LEAD FRAME, SEMICONDUCTOR DEVICE, AND METHOD FOR MANUFACTURING SEMICONDUCTOR DEVICE

CROSS REFERENCE TO RELATED APPLICATIONS

This application is based upon and claims the benefit of priority from the prior Japanese Patent Application No. P2018-215433 filed on Nov. 16, 2018, the entire contents of which are incorporated herein by reference.

BACKGROUND OF THE INVENTION

Field of the Invention

The present invention relates to a lead frame, a semiconductor device, and a method for manufacturing a semiconductor device.

Description of the Related Art

In recent years, it has become possible to manufacture a high-breakdown-voltage and high-performance semiconductor chip as typified by a wideband gap semiconductor, so that a high-breakdown-voltage discrete semiconductor product has increased. Accordingly, the withstand voltage of a package has been regarded as important (for example, see PTLS 1 and 2). Moreover, in order to improve the efficiency of a power inverter circuit and reduce the size of a product, the semiconductor product has been demanded to have low ON resistance and a small package.

FIGS. 17 and 18 are plan views illustrating a method for manufacturing a semiconductor device according to a conventional example. FIG. 19 is a plan view illustrating a configuration example of the semiconductor device according to the conventional example. FIG. 20 is a rear view illustrating the configuration example of the semiconductor device according to the conventional example.

As illustrated in FIG. 17, a lead frame 301 according to the conventional example contains a plurality of elements 310A, 310B, and 310C. The plurality of elements 310A, 310B, and 310C each are a part serving as one semiconductor device 300. The elements 310A, 310B, and 310C are arranged and adjacent to each other in the K-axis direction. Hereinafter, when the plurality of elements 310A, 310B, and 310C are not required to be distinguished is the description, these elements 310A, 310E, and 310C are referred to as the elements 310. Although not illustrated, the plurality of elements are arranged and adjacent to each other also in the Y-axis direction.

Each element 310 has a die pad portion 319 to which a semiconductor chip 302 is attached and three terminal portions 311, 312, and 313. The terminal portions 311, 312, and 313 each extend in the Y-axis direction. Moreover, the terminal portions 311, 312, and 313 are disposed in this order in the X-axis direction. The terminal portion 312 is connected to the die pad portion 319.

Each element 310 has a first lead post portion 314 and a second lead post portion 315. The first lead post portion 314 is positioned between the die pad portion 319 and the terminal portion 311 and connected to the terminal portion 311. The second lead post portion 315 is positioned between the die pad portion 319 and the terminal portion 313 and connected to the terminal portion 313. The die pad portion 319, the first lead post portion 314, and the second lead post portion 315 are separated from each other.

In the lead frame 301, the terminal portion 312 is connected to the die pad portion 319. The die pad portion 319 and the terminal portion 312 support each other. A support portion 316 is connected to the terminal portions 311, 312, and 313 and a frame body 330 of the lead frame 301 in the X-axis direction. Thus, the terminal portions 311, 312, and 313 have a structure of supporting each other and being supported by the frame body 330.

The semiconductor device 300 according to the conventional example is manufactured using various devices, such as a die bonding device, a wire bonding device, and a molding device, for example. Hereinafter, these devices are referred to as manufacturing devices.

As illustrated in FIG. 17, the manufacturing device mounts the semiconductor chip 302 on the die pad portion 319 of the lead frame 301 in a die bonding process. Thus, a drain electrode positioned on the rear surface side of the semiconductor chip 302 is electrically connected to the terminal portion 312 through the die pad portion 319. The terminal portion 312 serves as a drain terminal portion D of the semiconductor device 300. Hereinafter, the terminal portion 312 is also referred to as the drain terminal portion D.

Next, in a wire bonding process, the manufacturing device loins one end of a first wire 331 to a gate electrode positioned on the front surface side of the semiconductor chip 302 and loins the other end of the first wire 331 to the first lead post portion 314 to electrically connect the gate electrode and the first lead post portion 314. Thus, the terminal portion 311 connected to the first lead post portion 314 serves as a gate terminal portion G of the semiconductor device 300. Hereinafter, the terminal portion 311 is also referred to as the gate terminal portion G.

Moreover, the manufacturing device joins one end of a second wire 332 to a source electrode positioned on the front surface side of the semiconductor chip 302 and joins the other end of the second wire 332 to the second lead post portion 315 to electrically connect the source electrode and the second lead post portion 315. Thus, the terminal portion 313 connected to the second lead post portion 315 serves as a source terminal portion S of the semiconductor device 300. Hereinafter, the terminal portion 313 is also referred to as the source terminal portion S.

Next, as illustrated in FIG. 18, the manufacturing device molds a sealing resin 304 using a transfer molding technology in a molding process. Next, the manufacturing device cuts out each element 310 from the lead frame 301 in a lead cutting process. In the lead cutting process, the support portion 316 is cut. Next, the manufacturing device molds the gate terminal portion 311 and the source terminal portion 313 to process them into the same shape as that of an end product in a forming process. Thus, the semiconductor device 300 is completed.

CITATION LIST

Patent Literatures

PTL 1: JP 2016-134492 A
PTL 2: JP 2011-129875 A

SUMMARY OF THE INVENTION

In a semiconductor chip, such as a MOSFET, the withstand voltage between a gate and a source is designed to be about 30 V in many cases. When the drain breakdown voltage is designed to be 30 V or more, the highest voltage among voltages applied to the semiconductor device 300 is the drain voltage. The withstand voltage of the sealing resin 304 is very high to the withstand voltage of air. Therefore, the withstand voltage of a package is determined by a distance L11 between the gate terminal portion 311 and the drain terminal portion 312 exposed from the sealing resin 304 or a distance 112 between the drain terminal portion 312 and the source terminal portion 313 exposed from the sealing resin 304. In the semiconductor device 300, it is effective to expand the distances L11 and L12 in order to increase the withstand voltage of the package.

However, the drain terminal portion 312 of the semiconductor device 300 is positioned between the gate terminal portion 311 and the source terminal portion 313. Therefore, when the design of the semiconductor device 300 is changed so as to increase the distance L11 between the gate terminal portion 311 and the drain terminal portion 312 and the distance 112 between the drain terminal portion 312 and the source terminal portion 313, the outside dimension of the semiconductor device 300 increases.

When the outside dimension of the semiconductor device 300 increases, the outside dimension deviates from the predetermined standard, so that there is a possibility that the semiconductor device 300 loses versatility. Moreover, when the outside dimension of the semiconductor device 300 increases, there is also a possibility that the design of the circuit board which is the side on which the semiconductor device 300 is mounted needs to change. Furthermore, when the outside dimension of the semiconductor device 300 increases, there is also a possibility that the manufacturing process needs to change, so that the productivity of the semiconductor device 300 decreases or the manufacturing cost increases.

The present invention has been made focusing on the above-described problems. It is an object of the present invention to provide a lead frame, a semiconductor device, and a method for manufacturing a semiconductor device which are configured to be able to increase the withstand voltage while suppressing an increase in the outside dimension.

A lead frame according to one aspect of the present invention is provided with a die pad portion having a front surface, a first lead portion disposed apart from the die pad portion and extending in a first direction parallel to the front surface of the die pad portion, a second lead portion disposed apart from the die pad portion and the first lead portion and extending in the first direction, and an extension portion extending from a corner portion neighborhood of the die pad portion to the outside of the die pad portion in a direction parallel to the front surface of the die pad portion. The first lead portion has a first terminal portion and a first lead post portion positioned on a side closer to the die pad portion relative to the first terminal portion and electrically connected to the first terminal portion. The second lead portion has a second terminal portion, a third terminal portion positioned between the first terminal portion and the second terminal portion, and a second lead post portion positioned on a side closer to the die pad portion relative to the second terminal portion and the third terminal portion and electrically connected to the second terminal portion and the third terminal portion. The first lead post portion, the second lead post portion, and the extension portion are arranged in a second direction parallel to the front surface of the die pad portion. The second direction crosses the first direction.

A semiconductor device according to one aspect of the present invention is provided with a lead frame and a semiconductor chip having a first surface and a second surface positioned on a side opposite to the first surface, having a first electrode and a second electrode on the first surface side, and having a third electrode on the second surface side. The lead frame is provided with a die pad portion having a front surface and electrically connected to the third electrode by the attachment of the semiconductor chip to the front surface side, a first lead portion disposed apart from the die pad portion and extending in a first direction parallel to the front surface of the die pad portion, a second lead portion disposed apart from the die pad portion and the first lead portion and extending in the first direction, and a first extension portion extending from a corner portion neighborhood of the die pad portion to the outside of the die pad portion in a direction parallel to the front surface of the die pad portion. The first lead portion has a first terminal portion and a first lead post portion positioned on a side closer to the die pad portion relative to the first terminal portion and electrically connected to the first terminal portion. The second lead portion has a second terminal portion, a third terminal portion positioned between the first terminal portion and the second terminal portion, and a second lead post, portion positioned on a side closer to the die pad portion relative to the second terminal portion and the third terminal portion and electrically connected to the second terminal portion and the third terminal portion. The first lead post portion, the second lead post portion, and the first extension portion are arranged in a second direction parallel to the front surface of the die pad portion. The second direction crosses the first direction.

A method for manufacturing a semiconductor device according to one aspect of the present invention includes a process of preparing a lead frame. The lead frame is provided with a die pad portion having a front surface, a first lead portion disposed apart from the die pad portion and extending in a first direction parallel to the front surface of the die pad portion, a second lead portion disposed apart from the die pad portion and the first lead portion and extending in the first direction, and an extension portion extending from a corner portion neighborhood of the die pad portion to the outside of the die pad portion in a direction parallel to the front surface of the die pad portion. The first lead portion has a first terminal portion and a first lead post portion positioned on a side closer to the die pad portion relative to the first terminal portion and electrically connected to the first terminal portion. The second lead portion has a second terminal portion, a third terminal portion positioned between the first terminal portion and the second terminal portion, and a second lead post portion positioned on a side closer to the die pad portion relative to the second terminal portion and the third terminal portion and electrically connected to the second terminal portion and the third terminal portion. The first lead post portion, the second lead post portion, and the extension portion are arranged in a second direction parallel to the front surface of the die pad portion. The second direction crosses the first direction. The method for manufacturing the semiconductor device according to one aspect of the present invention further includes a process of preparing a semiconductor chip having a first electrode and a second electrode on a side of a first surface and having a third electrode on a side of a second surface positioned on a side opposite to the first surface, a process of attaching the second surface side of the semiconductor chip to the front surface side of the die pad portion and electrically connecting the third electrode and the die pad portion, a process of electrically connecting the first electrode and the first lead post portion using a first wire, a process of electrically connecting the second electrode and the second lead post portion using a second wire, and a process of covering and sealing the semiconductor chip, the first lead post portion, the second lead post portion, the first wire, and the second wire with a sealing resin. In the sealing process, the front surface side of the die pad portion is covered with the sealing resin and the rear surface positioned on the side opposite to the front surface of the die pad portion is exposed from the sealing resin.

The present invention can provide a lead frame, a semiconductor device, and a method for manufacturing a semiconductor device which are configured to be able to increase the withstand voltage while suppressing an increase in the outside dimension.

DESCRIPTION OF THE PREFERRED EMBODIMENTS

Figure 1:
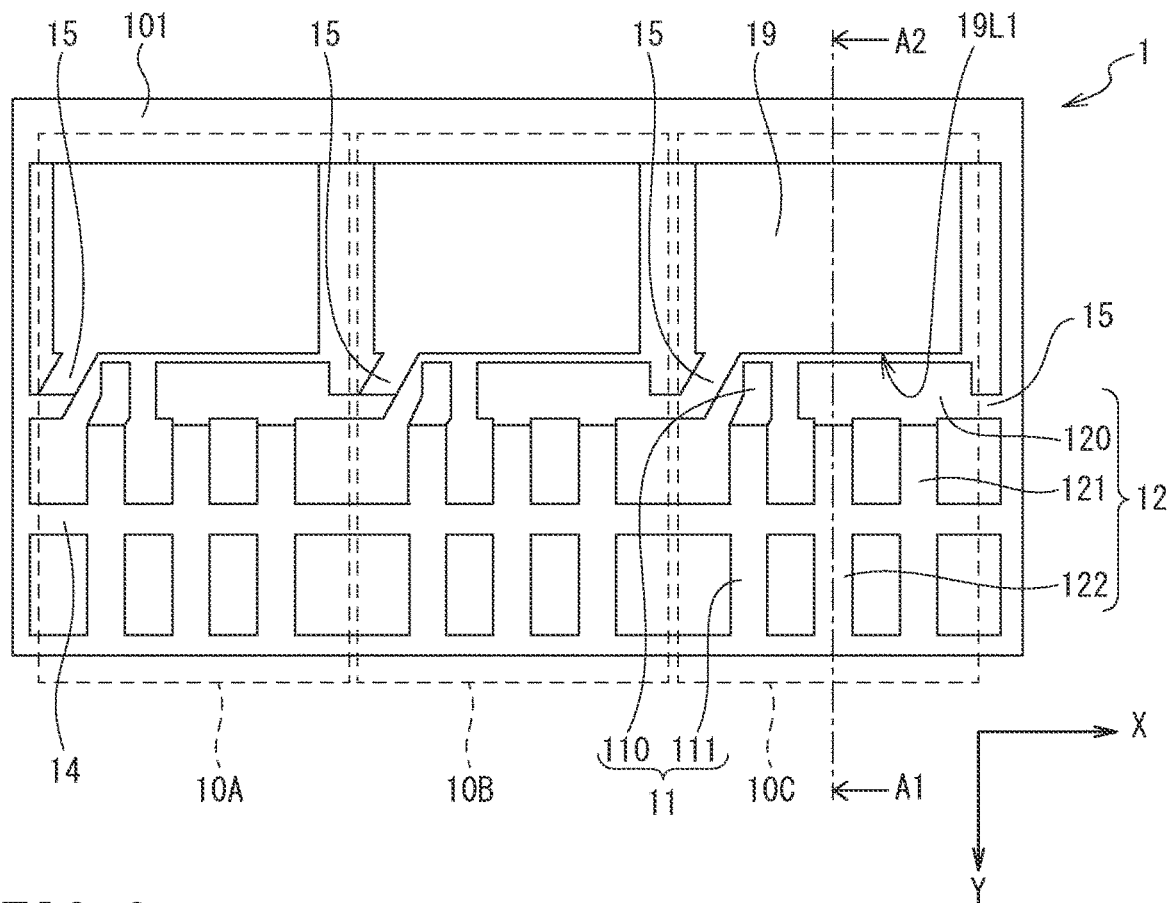
FIG. 1 is a plan view illustrating a configuration example of a lead frame according to Embodiment 1 of the present invention.

Hereinafter, an embodiment of the present invention is described. In the following description of the drawings, the same or similar portions are designated by the same or similar reference numerals. However, it should be noted that the drawings are schematic and the relationship between the thickness and the plane dimension, the ratio in thickness of the devices and the members, and the like are different from actual relationship, ratio, and the like. Therefore, specific thickness and dimension should be determined considering the following description. It is a matter of course that the drawings also include portions having dimensional relationships and ratios different from each other.

In the description of the following drawings, the directions are indicated using an X-axis direction, a Y-axis direction, and a Z-axis direction in some cases. For example, the X-axis direction and the Y-axis direction are directions parallel to a front surface 19*a* of a die pad portion 19 described later. The Z-axis direction is the thickness direction of the die pad portion 19 described later. The X-axis direction, the Y-axis direction, and the Z-axis direction are orthogonal to each other. The X, Y, and Z axes form a right-handed system.

In the following description, the positive direction of the Z axis is referred to as "top" and the negative direction of the Z axis is referred to as "bottom" in some cases. The "top" and the "bottom" do not necessarily mean the vertical direction to the ground. More specifically, the directions of the "top" and the "bottom" are not limited to the gravity direction. The "top" and the "bottom" are merely convenient expressions specifying the relative positional relationship in a layer, a substrate, and the like and do not limit the technological idea of the present invention. For example, it is a matter of course that, when the sheet is rotated 180°, the "top" becomes the "bottom" and the "bottom" becomes the "top". A "plan view" means seeing from the Z axis (for example, normal direction of the front surface 19*a* of the die pad portion 19).

Embodiment 1

Figure 2:
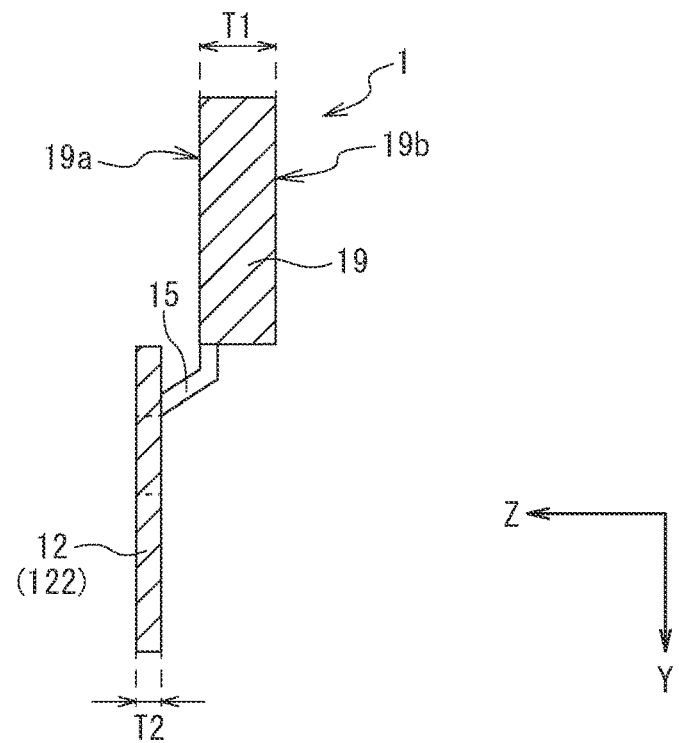
FIG. 2 is a cross-sectional view in which the plan view illustrated in FIG. 1 is cut along the A1-A2 line.
Figure 3:
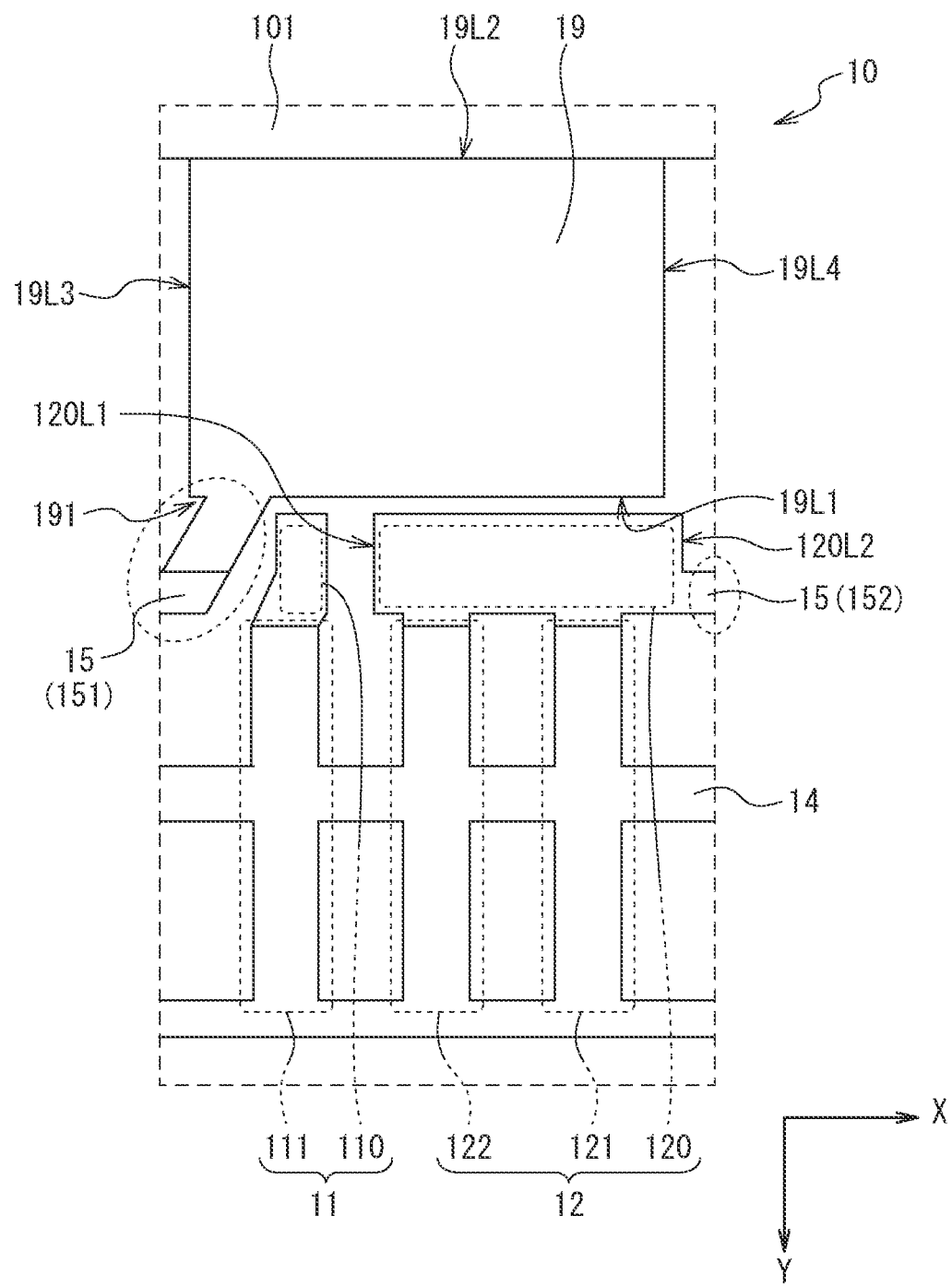
FIG. 3 is a plan view illustrating one element of the lead frame according to Embodiment 1 of the present invention in an enlarged manner.

FIG. 1 is a plan view illustrating a configuration example of a lead frame according to Embodiment 1 of the present invention. FIG. 2 is a cross-sectional view in which the plan view illustrated in FIG. 1 is cut along the A1-A2 line. FIG. 3 is a plan view illustrating one element of the lead frame according to Embodiment 1 of the present invention in an enlarged manner.

As illustrated in FIG. 1, the lead frame 1 according to Embodiment 1 contains a plurality of elements 10A, 10B, and 10C. The elements 10A, 10B, and 10C each are a part serving as one semiconductor device 100 (see FIGS. 8 to 11 described later). The plurality of elements 10A, 10B, and 10C are arranged and adjacent to each other in the X-axis direction. Hereinafter, when the plurality of elements 10A, 10B, and 10C are not required to be distinguished in the description, the elements 10A, 10B, and 10C are referred to as the elements 10. The lead frame 1 may also contain four or more elements 10. Although not illustrated, also in the Y-axis direction, the plurality of elements are arranged and adjacent to each other. The lead frame 1 is provided with a frame body 101 disposed so as to collectively surround the plurality of elements 10 from the outside. The elements 10 adjacent to the frame body 101 in the X-axis direction among the plurality of elements 10 are connected to the frame body 101 through the extension portions 15.

Each element 10 has a first lead portion 11, a second lead portion 12, a connection portion 14, an extension portion 15, and a die pad portion 19 to which a semiconductor chip 2 (see FIG. 4 described later) is attached. As illustrated in FIG. 2, the die pad portion 19 has the front surface 19a and a rear surface 19b positioned on the side opposite to the front surface 19a. The front surface (principal surface) 19a of the die pad portion 19 is a region where the semiconductor chip 2 is mounted. The rear surface (principal surface) 19b of the die pad portion 19 is a region serving as a drain terminal portion of the semiconductor device 100. The front surface 19a and the rear surface 19b of the die pad portion 19 each are parallel to the X-axis direction and Y-axis direction. The shape as viewed in plan of the die pad portion 19 is a rectangle. The die pad portion 19 has a shape defined by a pair of sides 19L1 and 19L2 parallel to the X-axis direction and facing each other and a pair of sides 19L3 and 19L4 parallel to the Y-axis direction and facing each other.

As illustrated in FIGS. 1 to 3, the first lead portion 11 and the second lead portion 12 are disposed apart from the die pad portion 19. The first lead portion 11 and the second lead portion 12 each extend in the Y-axis direction.

The first lead portion 11 has a first lead post portion 110 and a first terminal portion 111. The first lead post portion 110 is a region to which one end of a first wire 31 (see FIG. 1 described later) is joined. The first lead post portion 110 is positioned on a side closer to the die pad portion 19 relative to the first terminal portion 111 and electrically connected to the first terminal portion 111. For example, the first lead post portion 110 and the first terminal portion 111 are integrally formed.

The second lead portion 12 has a second lead post portion 120, a second terminal portion 121, and a third terminal portion 122. The second lead post portion 120 is a region to which one end of a second wire 32 (see FIG. 4 described later) is joined. The second lead post portion 120 is positioned on a side closer to the die pad portion 19 relative to the second terminal portion 121 and the third terminal portion 122. The second lead post portion 120 is electrically connected to the second terminal portion 121 and the third terminal portion 122. For example, the second lead post portion 120, the second terminal portion 121, and the third terminal portion 122 are integrally formed in each element 10, the third terminal portion 122 is positioned between the first terminal portion 111 and the second terminal portion 121 in the X-axis direction.

The connection portion 14 couples the first terminal portion 111, the third terminal portion 122, and the second terminal portion 121 in the X-axis direction in the elements 10. Moreover, the connection portion 14 couples the first terminal portion 111 and the second terminal portion 121 between the elements 10 adjacent to each other in the X-axis direction. For example, the connection portion 14 couples the second terminal portion 121 of the element 10A and the first terminal portion 111 of the element 10B adjacent to the element 10A in the X-axis direction. The connection portion 14 couples the second terminal portion 121 of the element 10B and the first terminal portion 111 of the element 105 adjacent to the element 10B in the X-axis direction. More-over, the connection portion 14 couples the frame body 101 and the first terminal portion 111 or the second terminal portion 121 adjacent to the frame body 101 in the X-axis direction. For example, the connection portion 14 couples the frame body 101 and the first terminal portion 111 of the element 10A adjacent to the frame body 101 in the X-axis direction. Moreover, the connection portion 14 couples the frame body 101 and the second terminal portion 121 of the element 10C adjacent to the frame body 101 in the X-axis direction. The connection portion 14 is integrally formed with the first terminal portion 111, the second terminal portion 121, and the third terminal portion 122.

The extension portion 15 extends from a corner portion neighborhood 191 of the die pad portion 19 to the outside of the die pad portion 19. The corner portion neighborhood 191 refers to a portion where the side 19L1 and the side 19L3 configuring an outer edge portion of the die pad portion 19 connect to each other and a region in the neighborhood thereof.

The extension portion 15 contains a first extension portion 151 connected to the corner portion neighborhood 191 of the die pad portion 19 and a second extension portion 152 connected to the second lead post portion 120. Between the elements 10 adjacent to each other in the X-axis direction, the first extension portion 151 and the second extension portion 152 are connected to each other. For example, the second extension portion 152 of the element 10A and the first extension portion 151 of the element 10B are connected to each other. Moreover, the second extension portion 152 of the element 10B and the first extension portion 151 of the element 10C are connected to each other. Moreover, the first extension portion 151 of the element 10A adjacent to the frame body 101 in the X-axis direction is connected to the frame body 101. The second extension portion 152 of the element 10C adjacent to the frame body 101 in the X-axis direction is connected to the frame body 101.

As illustrated in FIGS. 1 and 3, the extension portion 15, the first lead portion 11, and the second lead portion 12 are disposed in this order along the X-axis direction (e.g., along the side 19L1 of the die pad portion 109). As illustrated in FIG. 2, a thickness T1 of the die pad portion 19 is larger than a thickness T2 of the second lead portion 12 (T1>T2). Moreover, the thickness T1 of the die pad portion 19 is larger than a thickness of each of the first lead portion 11, the connection portion 14, and the extension portion 15. For example, the thickness of each of the first lead portion 11, the connection portion 14, and the extension portion 15 is the same as the thickness of the second lead portion 12. The lead frame 1 contains copper (Cu), Cu alloys containing Cu as the main component, aluminum (Al), or Al alloys containing Al as the main component, for example.

Figure 4:
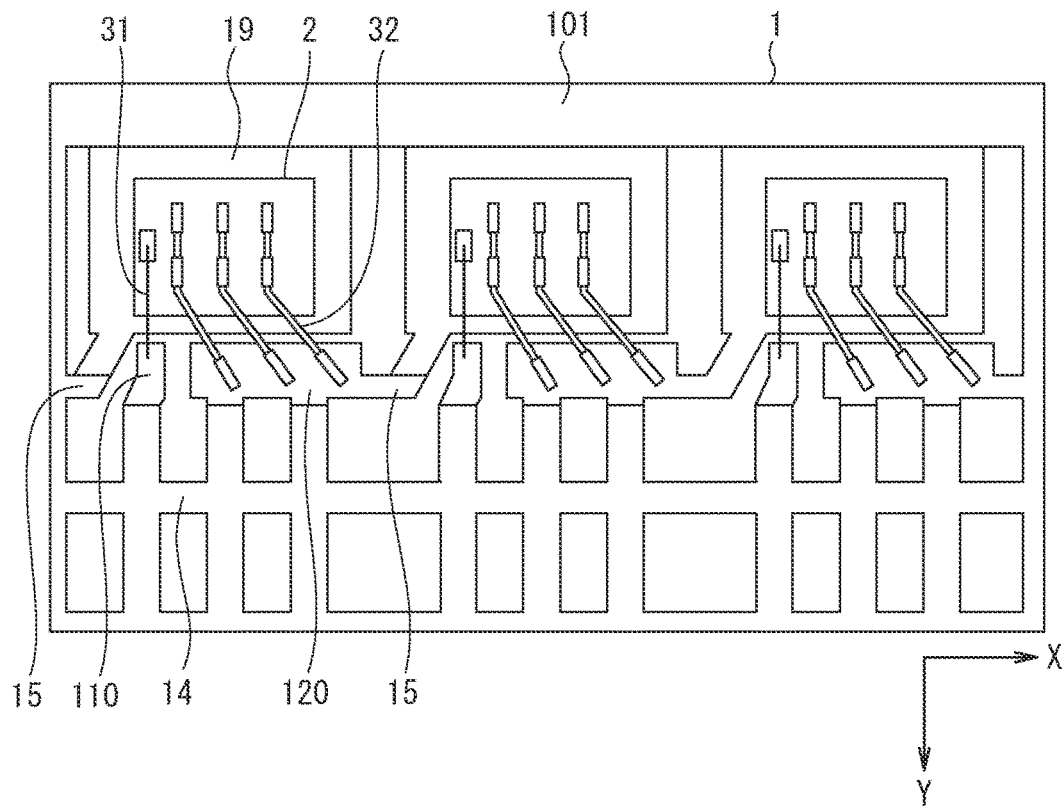
FIG. 4 is a plan view illustrating a method for manufacturing a semiconductor device according to Embodiment 1 of the present invention.
Figure 5:
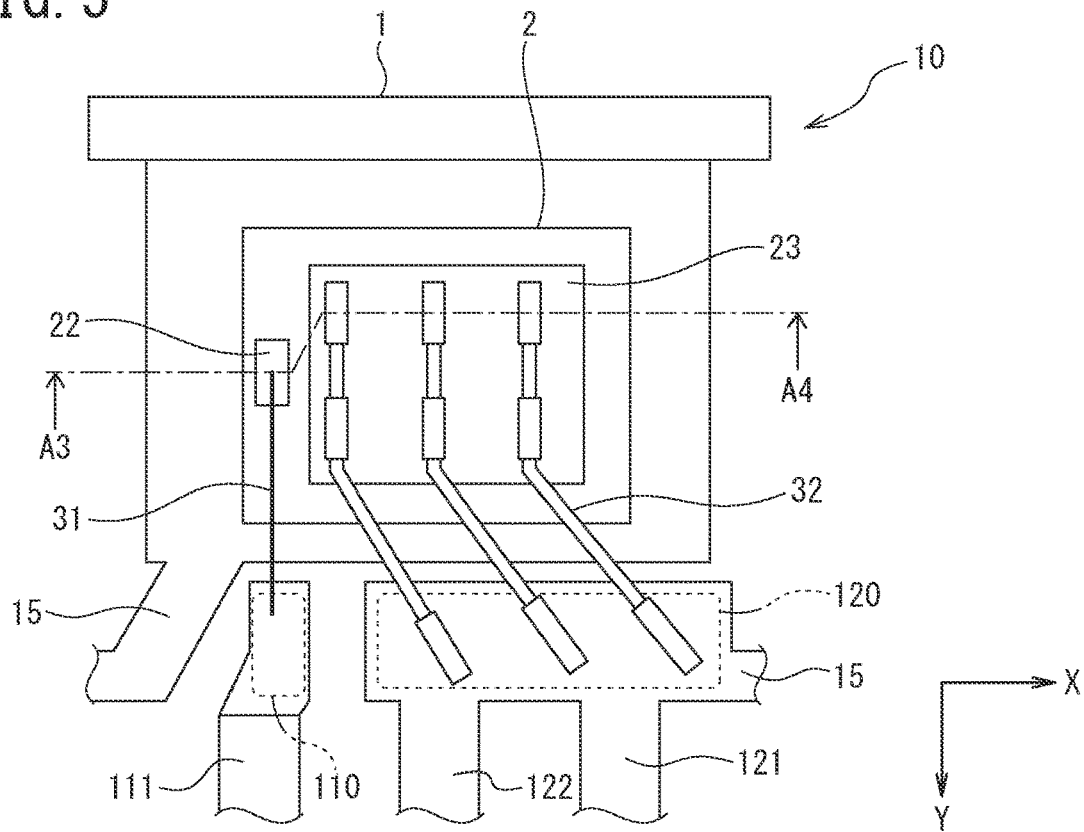
FIG. 5 is a plan view illustrating a part of FIG. 4 in an enlarged manner.
Figure 6:
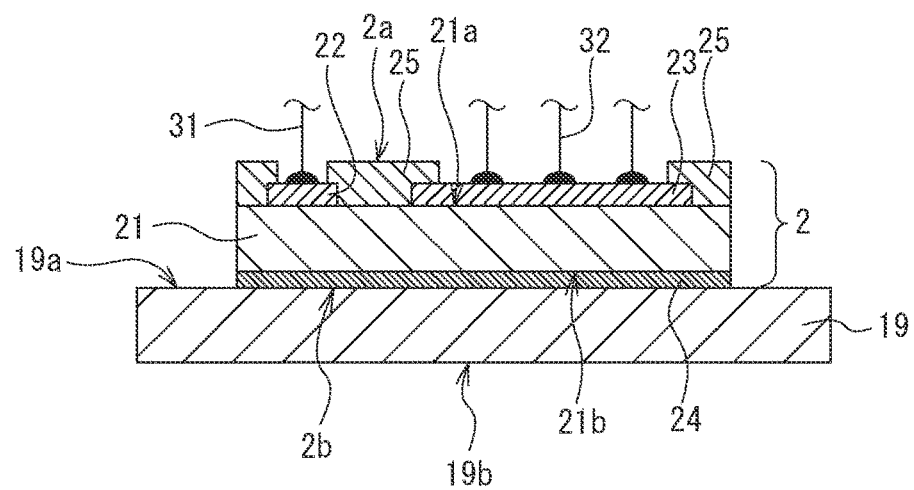
FIG. 6 is a cross-sectional view in which the plan view illustrated in FIG. 5 is cut along the A3-A4 line.
Figure 7:
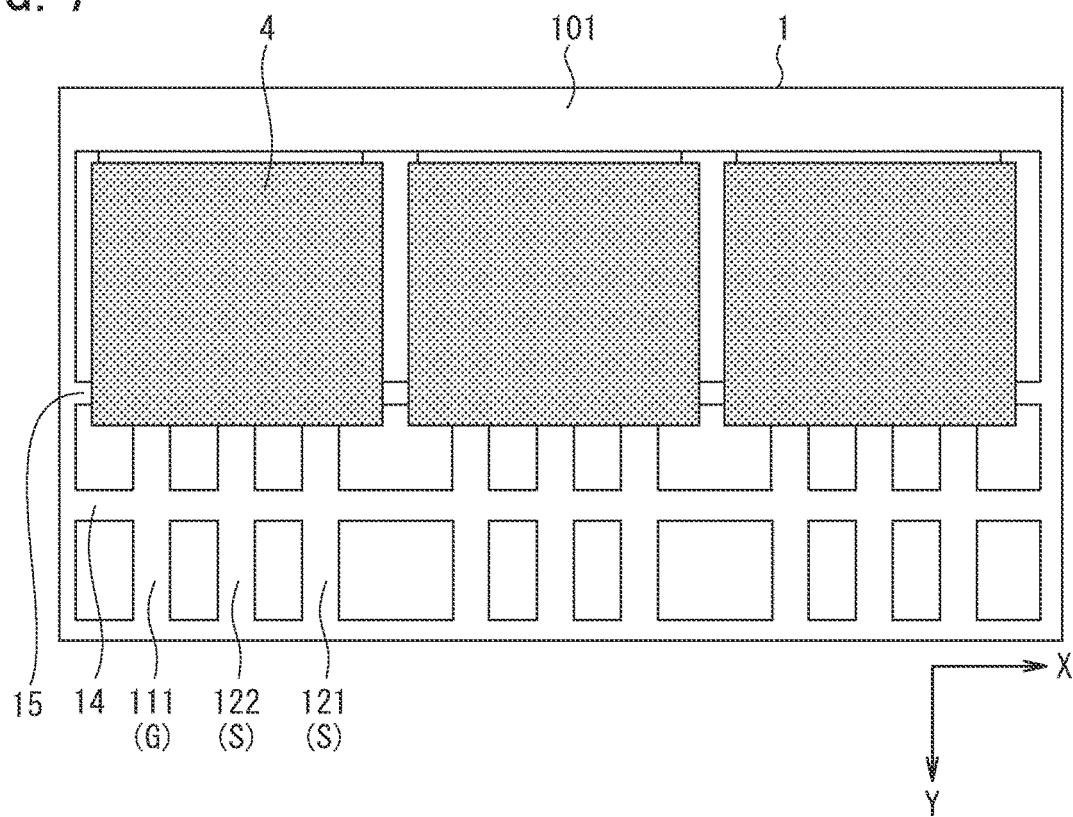
FIG. 7 is a plan view illustrating the method for manufacturing the semiconductor device according to Embodiment 1 of the present invention.

Next, a method for manufacturing a semiconductor device using the lead frame 1 illustrated in FIG. 1 is described. FIG. 4 is a plan view illustrating a method for manufacturing a semiconductor device according to Embodiment 1 of the present invention. FIG. 5 is a plan view illustrating a part of FIG. 4 in an enlarged manner. FIG. 6 is a cross-sectional view in which the plan view illustrated in FIG. 5 is cut along the A3-A4 line. FIG. 7 is a plan view illustrating the method for manufacturing a semiconductor device according to Embodiment 1 of the present invention. The semiconductor device 100 is manufactured using various manufacturing devices, such as a die bonding device, a wire bonding device, and a molding device, for example.

As illustrated in FIGS. 4 to 6, in a die bonding process, the manufacturing device mounts the semiconductor chip 2 on the front surface 19a of the die pad portion 19. The semiconductor chip 2 is a power MOSFET (metal oxide semiconductor field effect transistor), for example, and has a front surface 2a and a rear surface 2b positioned on the side opposite to the front surface 2a. The semiconductor chip 2 has a gate electrode 22 and a source electrode 23 on the front surface 2a side and has a drain electrode 24 on the rear surface 2b side. For example, as illustrated in FIG. 6, the semiconductor chip 2 has a base material 21 containing a semiconductor, such as silicon (Si), the gate electrode 22 and the source electrode 23 positioned on a side of a front surface 21a of the base material 21, and the drain electrode 24 positioned on a side of a rear surface 21b of the base material 21. The semiconductor chip 2 has an insulating protective film 25 provided on the front surface 21a side of the base material 21. The gate electrode 22 and the source electrode 23 are exposed from the protective film 25.

In the die bonding process, the drain electrode 24 positioned on the rear surface 2b side of the semiconductor chip 2 is joined to the front surface 19a of the die pad portion 19 through a conductive joining material, such as solder. By this joining, the drain electrode 24 and the die pad portion 19 are electrically connected to each other. The rear surface 19b of the die pad portion 19 serves as a drain terminal portion D of the semiconductor device 100.

Next, in a wire bonding process, the manufacturing device joins one end of the first wire 31 to the gate electrode 22 positioned on the front surface 2a side of the semiconductor chip 2 and joins the other end of the first wire 31 to the first lead post portion 110 to electrically connect the gate electrode 22 and the first lead post portion 110. The first terminal portion 111 connected to the first lead post portion 110 serves as the gate terminal portion G of the semiconductor device 100.

The manufacturing device joins one end of the second wire 32 to the source electrode 23 positioned on the front surface 2a side of the semiconductor chip 2 and joins the other end of the second wire 32 to the second lead post portion 120 to electrically connect the source electrode 23 and the second lead post portion 120. The second terminal portion 121 and the third terminal portion 122 connected to the second lead post portion 120 serve as source terminal portions S of the semiconductor device 100.

Figure 17:
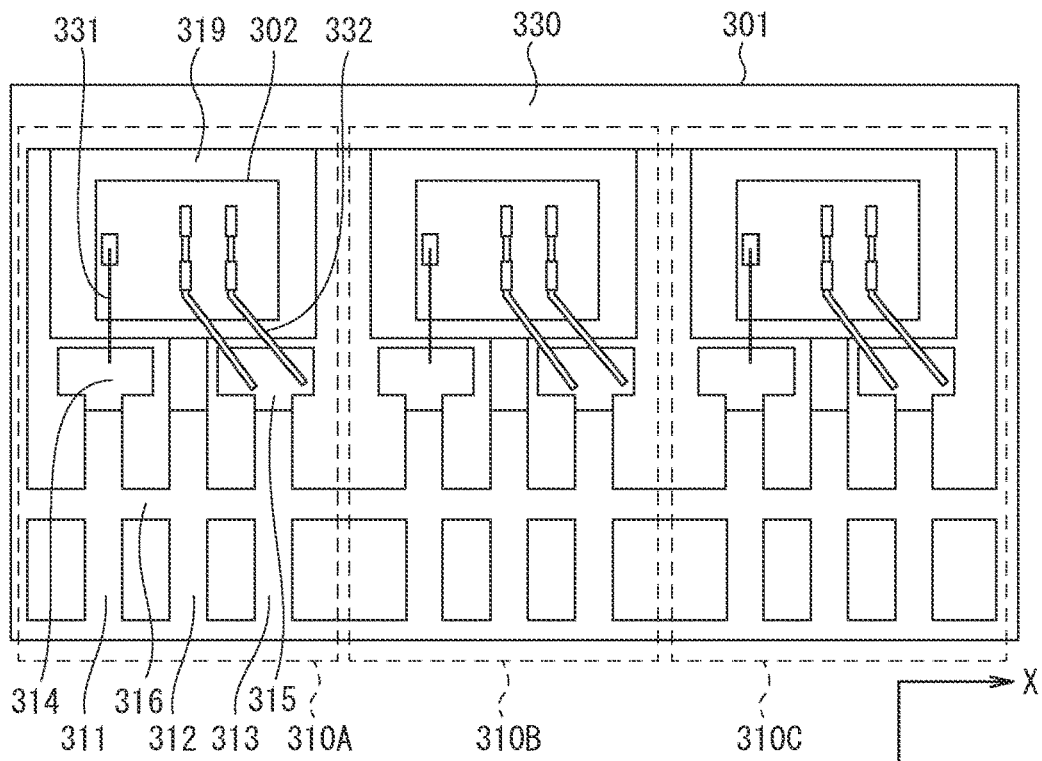
FIG. 17 is a plan view illustrating a method for manufacturing a semiconductor device according to a conventional example.
Figure 18:
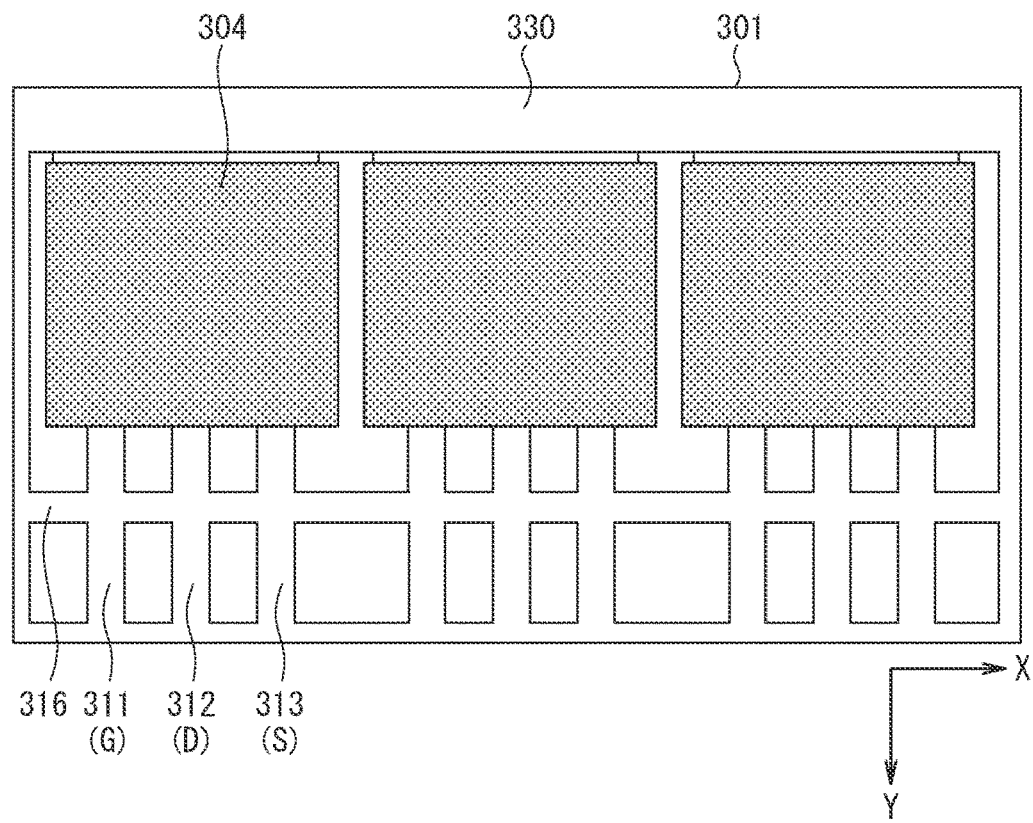
FIG. 18 is a plan view illustrating the method for manufacturing the semiconductor device according to the conventional example.

As illustrated in FIG. 5, the length in the X-axis direction is longer and the area is larger in the second lead post portion 120 than in the first lead post portion 110. Thus, a larger number of wires having a large diameter can be jointed to the second lead post portion 120. For example, the diameter of the second wire 32 can be increased and the number thereof can also be increased as compared with the conventional example illustrated in FIG. 17. While two second wires 332 are joined to the second lead post portion in the conventional example, three second wires 32 can be joined in this example. Due to an increase in the total joining area of the second wires 32 and the source electrode 23, a reduction in electrical resistance is achieved. This contributes to a reduction in package resistance of the semiconductor device 100.

Next, the manufacturing device molds the sealing resin 4 in a molding process as illustrated in FIG. 7. The manufacturing device molds the sealing resin 4 using a transfer molding technology. For example, the manufacturing device injects a molten resin into a cavity surrounded by a lower die and an upper die, and then cures the injected resin within the cavity to mold the sealing resin 4. The sealing resin 4 contains an epoxy resin, for example.

Next, the manufacturing device cuts out each element 10 from the lead frame 1 in a lead cutting process. In the lead cutting process, the manufacturing device cuts the connection portion 14 and the extension portion 15. The extension portion 15 is cut to be divided into the first extension portion 151 and the second extension portion 152. Moreover, the manufacturing device cuts the third terminal portion 122 to make the length in the Y-axis direction of the third terminal portion 122 shorter than the length in the Y-axis direction of the second terminal portion 121 in the lead cutting process. For example, the third terminal portion 122 is cut near an outer edge portion of the sealing resin 4 so that a portion exposed from the sealing resin 4 of the third terminal portion 122 is largely removed.

Next, the manufacturing device molds the first terminal portion 111 and the second terminal portion 121 to process them into the same shape as that of an end product in a forming process. Thus, the semiconductor device 100 is completed.

Figure 8:
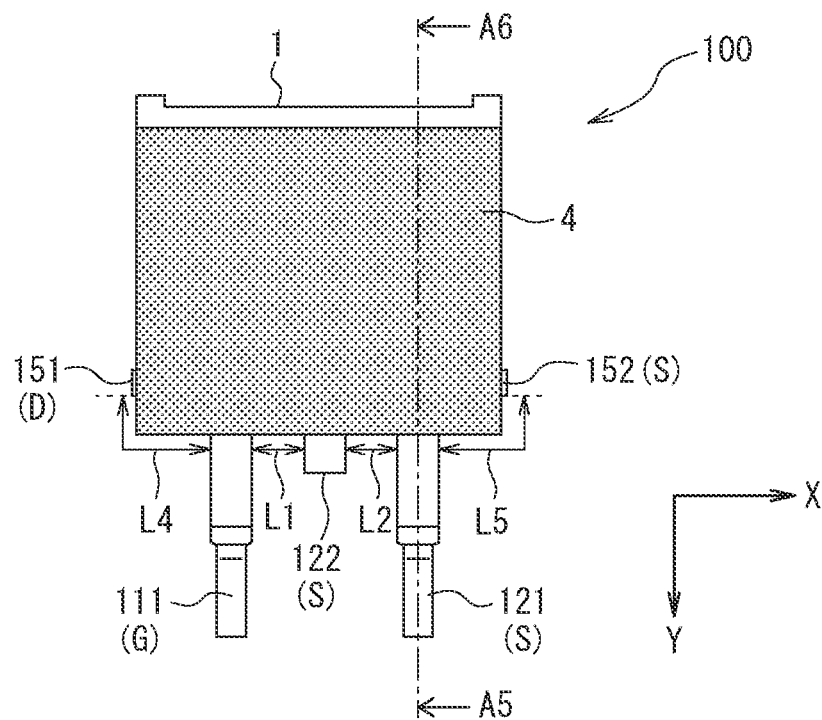
FIG. 8 is a front view illustrating a configuration example of the semiconductor device according to Embodiment 1 of the present invention.
Figure 9:
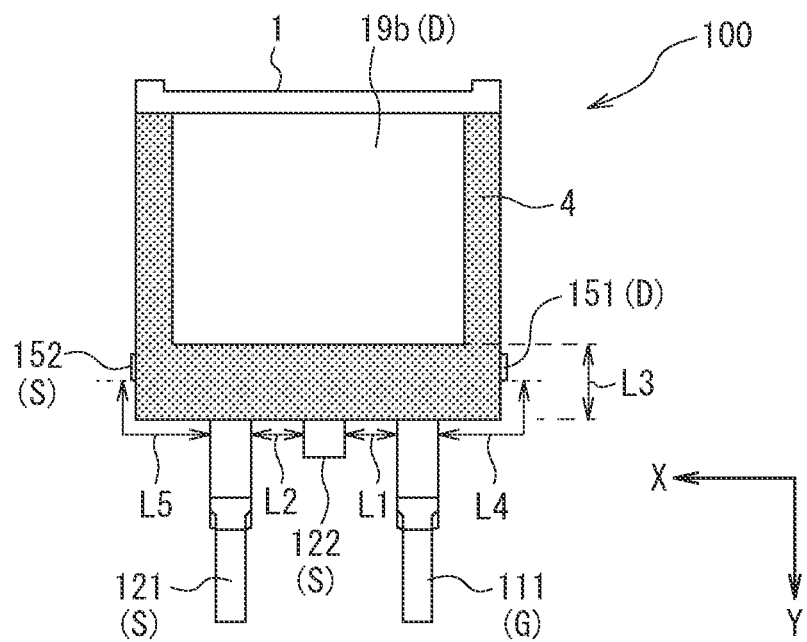
FIG. 9 is a rear view illustrating the configuration example of the semiconductor device according to Embodiment 1 of the present invention.
Figure 10:
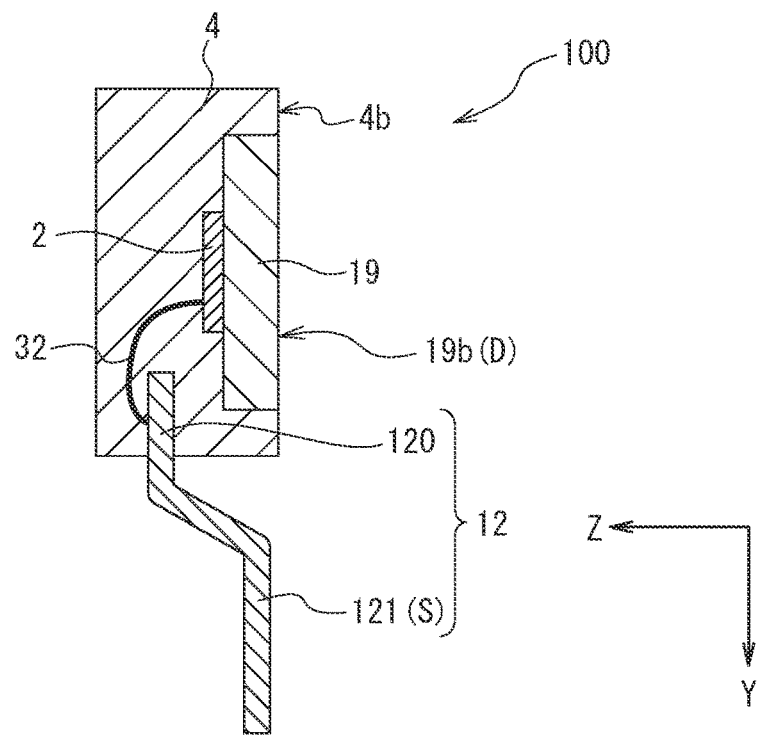
FIG. 10 is a cross-sectional view in which the front view illustrated in FIG. 8 is cut along the A5-A6 line.
Figure 11:
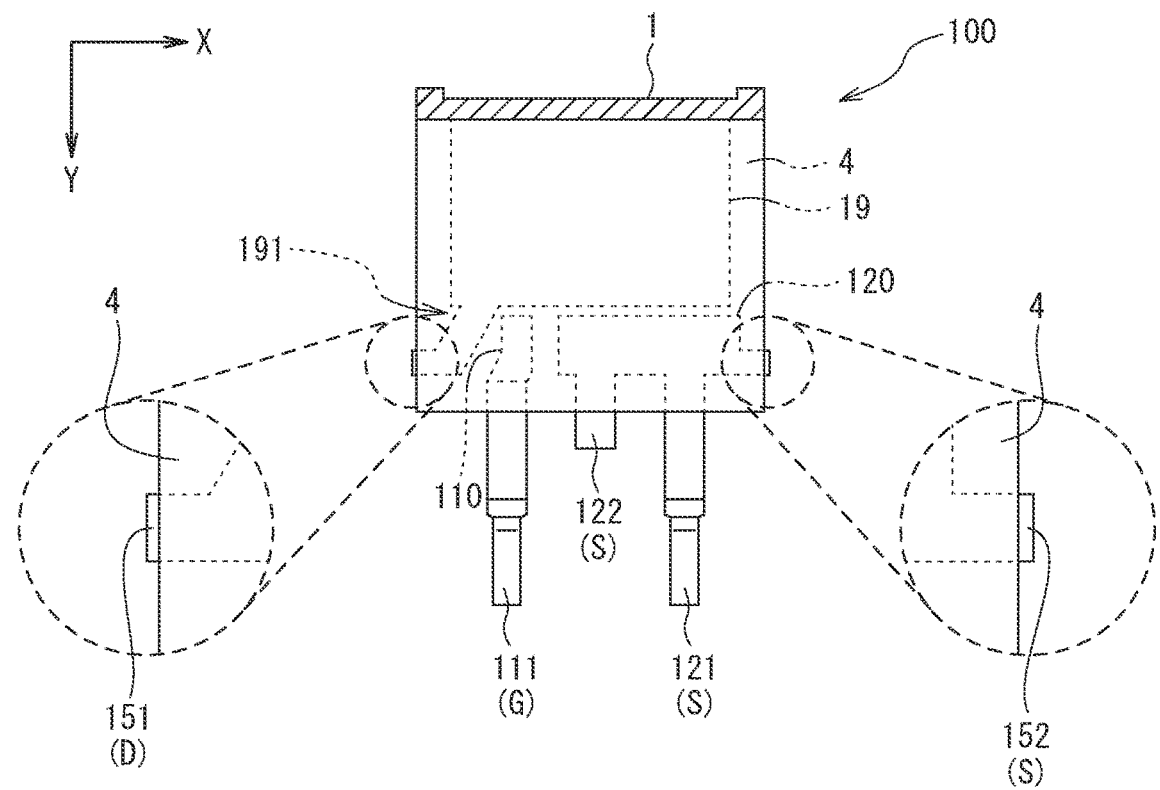
FIG. 11 is a front view illustrating a configuration example of the inside of the semiconductor device according to Embodiment 1 of the present invention.

FIG. 8 is a front view illustrating a configuration example of the semiconductor device 100 according to Embodiment 1 of the present invention. FIG. 9 is a rear view illustrating the configuration example of the semiconductor device 100 according to Embodiment 1 of the present invention. FIG. 10 is a cross-sectional view in which the front view illustrated in FIG. 8 is cut along the A5-A6 line. FIG. 11 is a front view illustrating a configuration example of the inside of the semiconductor device 100 according to Embodiment 1 of the present invention. FIG. 11 illustrates the sealing resin 4 in perspective.

As illustrated in FIG. 8, the front surface 19a side of the die pad portion 19 on which the semiconductor chip 2 is mounted is covered and sealed with the sealing resin 4. As illustrated in FIG. 9, the rear surface 19b side of the die pad portion 19 is exposed from the sealing resin 4. As described above, the portion exposed from the sealing resin 4 of the rear surface 19b of the die pad portion 19 functions as the drain terminal portion D of the semiconductor device 100. As illustrated in FIG. 10, the rear surface 19b (i.e., drain terminal portion D) of the die pad portion 19 is flush or almost flush with a rear surface 4b of the sealing resin 4. Or, the rear surface 19b (drain terminal portion D) of the die pad portion 19 may be somewhat projected from the rear surface 4b of the sealing resin 4. This makes it easy to surface-mount the rear surface 19b (drain terminal portion D) of the die pad portion 19 on a circuit board.

As illustrated in FIGS. 8 and 9, the first terminal portion 111, the second terminal portion 121, and the third terminal portion 122 each are exposed from the sealing resin 4. As described above, the first terminal portion 111 is electrically connected to the gate electrode 22 of the semiconductor chip 2 and functions as the gate terminal portion G. The second terminal portion 121 and the third terminal portion 122 are electrically connected to the source electrode 23 of the semiconductor chip 2 and function as the source terminal portions S.

In the semiconductor device 100, the magnitude of the distance between the terminal portions is specified in order to increase the withstand voltage of the package. For example, the distance between the first terminal portion 111 and the third terminal portion 122 is defined as L1 and the distance between the second terminal portion 121 and the third terminal portion 122 is defined as L2. The shortest distance from the portion which is the rear surface 19b of the die pad portion 19 and exposed from the sealing resin 4 to the first terminal portion 111, the second terminal portion 121, or the third terminal portion 122 is defined as L3. In the semiconductor device 100, it is preferable that the shortest distance L3 is longer than both the distance L1 and the distance L2 and satisfies the relationships of L3>L1 and L3>L2.

The semiconductor device 100 is a power MOSFET having a drain breakdown voltage of 30 V or more, for example. A drain voltage applied to the drain terminal portion D among voltages applied to the semiconductor device 100 is the highest voltage. The sealing resin 4 contains an epoxy resin or the like. The withstand voltage of the sealing resin 4 is very high to the withstand voltage of air. Therefore, the withstand voltage of the package determined by the distance between the drain terminal portion D exposed from the sealing resin 4 and the other terminal portions. In the semiconductor device 100, the shortest distance L3 described above determines the withstand voltage of the package.

In the semiconductor device 100, L1, L2, and L3 satisfy the relationships of L3>L1 and L3>L2 and the distance between the drain terminal portion D and the gate terminal portion G (or the source terminal portion S) may be longer than the distance between the gate terminal portion G and the source terminal portion S and the distance between a pair of source terminal portions S. This relationship can increase the withstand voltage of the package.

As illustrated in FIGS. 8, 9, and 11, the first extension portion 151 and the second extension portion 152 each are exposed from the sealing resin 4. The first extension portion 151 is connected to the die pad portion 19 and has the same potential as that of the drain terminal portion D. The second extension portion 152 is connected to the second lead post portion 120 and has the same potential as that of the source terminal portion S. Therefore, not only the shortest distance 13 but a shortest distance 14 influences the withstand voltage of the package of the semiconductor device 100. The shortest distance 14 is the distance along the outer edge portion of the sealing resin 4 and is the shortest distance from the first extension portion 151 to the first terminal portion 111. In the semiconductor device 100, it is preferable that L1, L2, and L4 satisfy the relationships of L4>L1 and L4>L2. The distance between the first extension portion 151 having a drain potential and the gate terminal portion G (or the source terminal portion S) may be longer than the distance between the gate terminal portion G and the source terminal portion S or the distance between the pair of source terminal portions S. This relationship can increase the withstand voltage of the package of the semiconductor device 100.

As described above, the lead frame 1 according to Embodiment 1 of the present invention has the die pad portion 19, the first lead portion 11 disposed apart, from the die pad portion 19 and extending in the first direction (for example, Y-axis direction) in the plane direction of the die pad portion 19 (for example, direction parallel to the front surface 19a), the second lead portion 12 disposed apart from the die pad portion 19 and the first lead portion 11 and extending in the Y-axis direction, and the extension portion 15 extending from the corner portion neighborhood 191 of the die pad portion 19 to the outside of the die pad portion 19 in the plane direction of the die pad portion 19.

The first lead portion 11 has the first terminal portion 111 and the first lead post portion 110 positioned on the side closer to the die pad portion 19 relative to the first terminal portion 111 and electrically connected to the first terminal portion 111. The second lead portion 12 has the second terminal portion 121, the third terminal portion 122 positioned between the first terminal portion 111 and the second terminal portion 121, and the second lead post portion 120 positioned on the side closer to the die pad portion 19 relative to the second terminal portion 121 and the third terminal portion 122 and electrically connected to the second terminal portion 121 and the third terminal portion 122. The first lead post portion 110, the second lead post portion 120, and the extension portion 15 are arranged in the second direction (for example, X-axis direction orthogonal to the Y-axis direction) crossing the Y-axis direction in the plane direction of the die pad portion 19.

According to this arrangement, one end of the first wire 31 is joined to the gate electrode 22 of the semiconductor chip 2 and the other end of the first wire 31 is joined to the first lead post portion 110, whereby the first terminal portion 111 connected to the first lead post portion 110 serves as the gate terminal portion G. One end of the second wire 32 is joined to the source electrode 23 of the semiconductor chip 2 and the other end of the second wire 32 is joined to the second lead post portion 120, whereby the second terminal portion 121 and the third terminal portion 122 connected to the second lead post portion 120 serve as the source terminal portions S. The drain electrode 24 of the semiconductor chip 2 is joined to the die pad portion 19, whereby the rear surface 19b of the die pad portion 19 serves as the drain terminal portion D.

In the X-axis direction, the gate terminal portion G and the source terminal portions S are adjacent to each other. In the Y-axis direction, the drain terminal portion D and the gate terminal portion G are adjacent to each other through the first lead post portion 110. In the Y-axis direction, the drain terminal portion D and the source terminal portions S are adjacent to each other through the second lead post portion 120. Thus, the shortest distance L3 between the drain terminal portion D and the gate terminal portion G (or the source terminal portion S) can be lengthened irrespective of the distance L1 between the gate terminal portion G and the source terminal portion S or the distance 12 between the source terminal portion S and the source terminal portion S. Thus, the lead frame 1 can increase the withstand voltage of the package while suppressing an increase in the outside dimension of the semiconductor device 100 using the lead frame 1.

Figure 19:
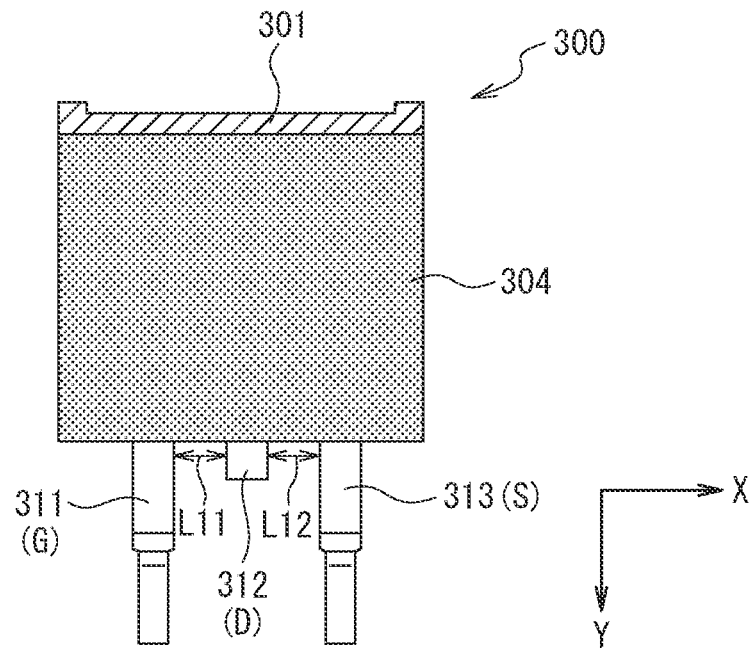
FIG. 19 is a plan view illustrating a configuration example of the semiconductor device according to the conventional example.
Figure 20:
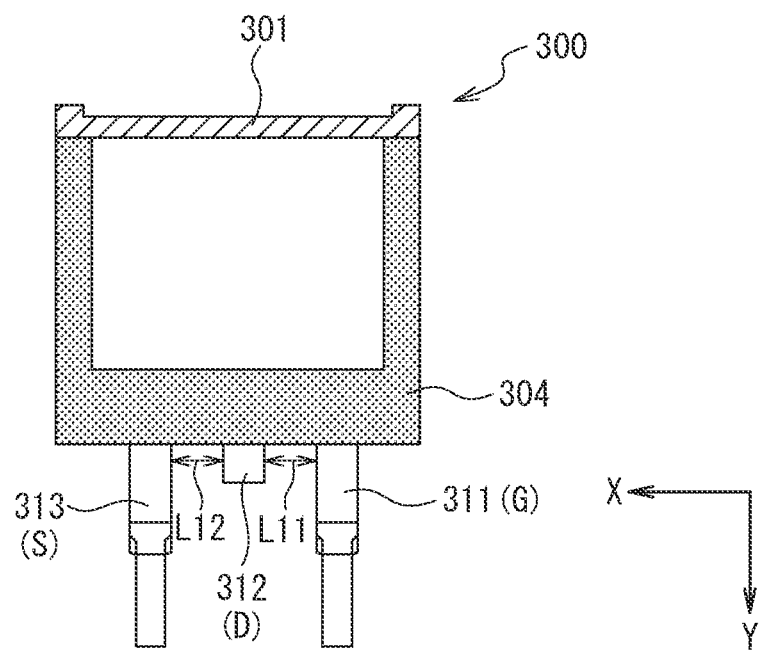
FIG. 20 is a rear view illustrating the configuration example of the semiconductor device according to the conventional example.

For example, the distance L1 between the first terminal portion 111 and the third terminal portion 122 may be the same length as that of the distance L11 (see FIGS. 19 and 20) of the conventional example. The distance L2 between the second terminal portion 121 and the third terminal portion 122 may be the same length as that of the distance L12 (see FIGS. 19 and 20) of the conventional example. More specifically, L1=L11 and L2=L12 may be acceptable. Also when the relationships are satisfied, the shortest distance L3 of Embodiment 1 can be lengthened and L3>L1 (=L11) and L3>L2 (=L12) can be set.

The lead frame 1 contains a first element (for example, element 10A) and a second element (for example, element 10B) adjacent to each other along the X-axis direction. The elements 10A and 10B each are provided with the die pad portion 19, the first lead portion 11, the second lead portion 12, and the extension portion 15. The extension portion 15 of the element 10A is connected to the second lead post portion 120 of the element 10B. According to this structure, two or more of the semiconductor devices 100 can be manufactured from one lead frame 1.

The semiconductor device 100 according to Embodiment 1 of the present invention has the lead frame 1 and the semiconductor chip 2 having a first surface (for example, front surface 2a) and the rear surface 2b positioned on the side opposite to the front surface 2a, having a first electrode (for example, gate electrode 22) and a second electrode (for example, source electrode 23) on the front surface 2a side, and having a third electrode (for example, drain electrode 24) on the rear surface 2b side. The lead frame 1 has the die pad portion 19 electrically connected to the drain electrode 24 by the attachment of the semiconductor chip 2 to one surface (for example, front surface 19a) side, the first lead portion 11 disposed apart from the die pad portion 19 and extending in the Y-axis direction in the plane direction of the die pad portion 19, the second lead portion 12 disposed apart from the die pad portion 19 and the first lead portion 11 and extending in the Y-axis direction, and the first extension portion 151 extending from the corner portion neighborhood 191 of the die pad portion 19 to the outside of the die pad portion 19 in the plane direction of the die pad portion 19. The first lead portion 11 has the first terminal portion 111 and the first lead post portion 110 positioned on the side closer to the die pad portion 19 relative to the first terminal portion 111 and electrical connected to the first terminal portion 111. The second lead portion 12 has the second terminal portion 121, the third terminal portion 122 positioned between the first terminal portion 111 and the second terminal portion 121, and the second lead post portion 120 positioned on the side closer to the die pad portion 19 relative to the second terminal portion 121 and the third terminal portion 122 and electrically connected to the second terminal portion 121 and the third terminal portion 122. The first lead post portion 110, the second lead post portion 120, and the first extension portion 151 are arranged in the X-axis direction orthogonal to the Y-axis direction in the plane direction of the die pad portion 19.

According to this structure, one end of the first wire 31 is joined to the gate electrode of the semiconductor chip 2 and the other end of the first wire 31 is joined to the first lead post portion 110, whereby the first terminal portion 111 connected to the first lead post portion 110 serves as the gate terminal portion G. One end of the second wire 32 is joined to the source electrode 23 of the semiconductor chip 2 and the other end of the second wire 32 is joined to the second lead post portion 120, whereby the second terminal portion 121 and the third terminal portion 122 connected to the second lead post portion 120 serve as the source terminal portions S. The drain electrode 24 of the semiconductor chip 2 is joined to the die pad portion 19, whereby the rear surface 19b of the die pad portion 19 serves as the drain terminal portion D.

In the X-axis direction, the gate terminal portion G and the source terminal portions S are adjacent to each other. In the Y-axis direction, the drain terminal portion D and the gate terminal portion G are adjacent to each other through the first lead post portion 110. In the Y-axis direction, the drain terminal portion D and the source terminal portions S are adjacent to each other through the second lead post portion 120. According to this arrangement, the shortest distance D between the drain terminal portion D and the gate terminal portion G (or the source terminal portion S) can be lengthened irrespective of the distance L1 between the gate terminal portion G and the source terminal portions S or the distance L2 between the source terminal portion S and the source terminal portion S. According to this distance L3, the semiconductor device 100 can increase the withstand voltage of the package while suppressing an increase in the outside dimension.

The semiconductor device 100 is further provided with the first wire 31 electrically connecting the gate electrode 22 and the first lead post portion 110, the second wire 32 electrically connecting the source electrode 23 and the second lead post portion 120, and the sealing resin 4 covering and sealing the semiconductor chip 2, the first lead post portion 110, the second lead post portion 120, the first wire 31, and the second wire 32. The other surface (for example, rear surface 19b) positioned on the side opposite to the front surface 19a of the die pad portion 19 is exposed from the sealing resin 4. According to this connection, the second terminal portion 121 and the third terminal portion 122 serve as the source terminal portions S. The rear surface 19b of the die pad portion 19 serves as the drain terminal portion D.

The distance between the first terminal portion 111 and the third terminal portion 122 is defined as L1. The distance between the second terminal portion 121 and the third terminal portion 122 is defined as 12. The shortest distance from the portion which is the rear surface 19b of the die pad portion 19 and exposed from the sealing resin 4 to the first terminal portion 111, the second terminal portion 121, or the third terminal portion 122 is defined as L3. L1, L2, and L3 may satisfy the relationships of L3>L1 and L3>L2. When the relationships are established, the shortest distance L3 determines the withstand voltage of the package of the semiconductor device 100 and the shortest distance L3 longer than the other distances L1 and L2 can increase the withstand voltage of the package.

The first extension portion 151 is exposed from the sealing resin 4. The distance between the first terminal portion 111 and the third terminal portion 122 is defined as L1. The distance between the second terminal portion 121 and the third terminal portion 122 is defined as L2. The shortest distance which is the distance along the outer edge portion of the sealing resin 4 from the first extension portion 151 to the first terminal portion 111 is defined as L4. L1, L2, and L4 may satisfy the relationships of L4>L1 and L4>L2. The first extension portion 151 has a drain potential when the relationships are established, the shortest distance L4 determines the withstand voltage of the package of the semiconductor device 100 and the shortest distance L4 longer than the other distances L1 and L2 can increase the withstand voltage of the package.

In the X-axis direction, the second lead post portion 120 is further provided with one outer edge portion 120L1 adjacent to the first lead post portion 110, the other outer edge portion 120L2 positioned on the side opposite to the one outer edge portion 120L1, and the second extension portion 152 extending from the other outer edge portion 120L2 to the outside of the second lead post portion 120. The first lead post portion 110, the second lead post portion 120, the first extension portion 151, and the second extension portion 152 are arranged in the X-axis direction.

The end surface of the first extension portion 151 and the end surface of the second extension portion 152 are symmetrically disposed to each other with respect to an arbitrary plane (for example, Y-Z plane parallel to the Y-axis and the Z-axis) orthogonal to the plane direction of the die pad portion 19.

The second extension portion 152 is exposed from the sealing resin 4. The distance between the first terminal portion 111 and the third terminal portion 122 is defined as L1. The distance between the second terminal portion 121 and the third terminal portion 122 is defined as L2. The shortest distance which is the distance along the outer edge portion of the sealing resin 4 from the second extension portion 152 to the second terminal portion 121 or the third terminal portion 122 is defined as L5. L1, L2, and L5 may satisfy the relationships of L5>L1 and L5>L2.

The method for manufacturing the semiconductor device 100 according to Embodiment 1 of the present invention includes the process of preparing the lead frame 1, the process of preparing the semiconductor chip 2, the process of attaching the rear surface 2b side of the semiconductor chip 2 to the front surface 19a side of the die pad portion 19 to electrically connect the drain electrode 24 and the die pad portion 19, the process of electrically connecting the gate electrode 22 and the first lead post portion 110 using the first wire 31, the process of electrically connecting the source electrode 23 and the second lead post portion 120 using the second wire 32, and the process of covering and sealing the semiconductor chip 2, the first lead post portion 110, the second lead post portion 120, the first wire 31, and the second wire 32 with the sealing resin 4. In the sealing process, the front surface 19a side of the die pad portion 19 is covered with the sealing resin 4 and the rear surface 19b of the die pad portion 19 is exposed from the sealing resin 4. Thus, the semiconductor device 100 capable of increasing the withstand voltage while suppressing an increase in the outside dimension can be manufactured.

The method for manufacturing the semiconductor device 100 further includes the process of cutting the portion which is the extension portion 15 and exposed from the sealing resin 4 after the sealing process. Thus, the extension portion 15 can be cut in a state where the lead frame 1, the semiconductor chip 2 attached to the lead frame 1, and the first wire 31 and the second wire 32 electrically connecting the lead frame 1 and the semiconductor chip 2 are fixed to each other with the sealing resin 4. Thus, a possibility that loose contact or disconnection occurs in the first wire 31 and the second wire 32 due to the vibration in cutting the extension portion 15 can be reduced.

Embodiment 2

Embodiment 1 above describes that the first extension portion 151 and the second extension portion 152 are exposed from the sealing resin 4. However, the embodiment of the present invention is not limited thereto. In the embodiment of the present invention, at least one of the first extension portion 151 and the second extension portion 152 may be completely covered with the sealing resin 4. More specifically, at least one of the first extension portion 151 and the second extension portion 152 may not be exposed from the sealing resin 4.

Figure 12:
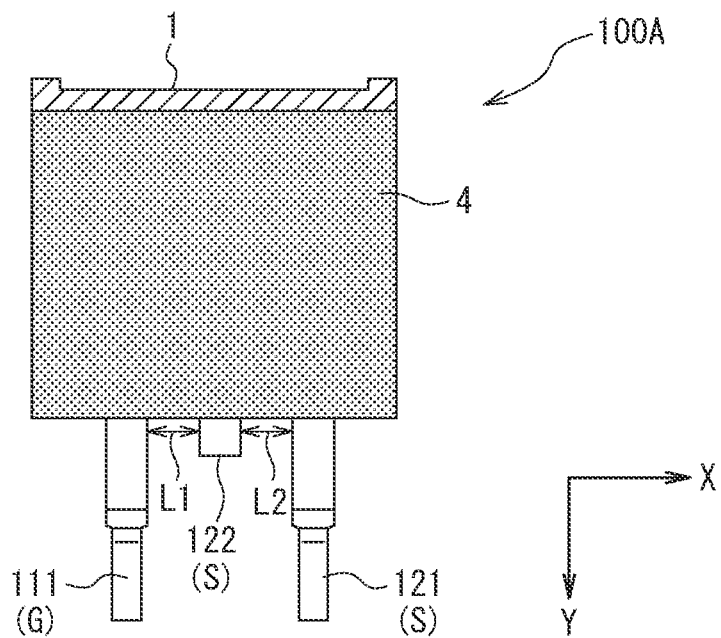
FIG. 12 is a front view illustrating a configuration example of a semiconductor device according to Embodiment 2 of the present invention.
Figure 13:
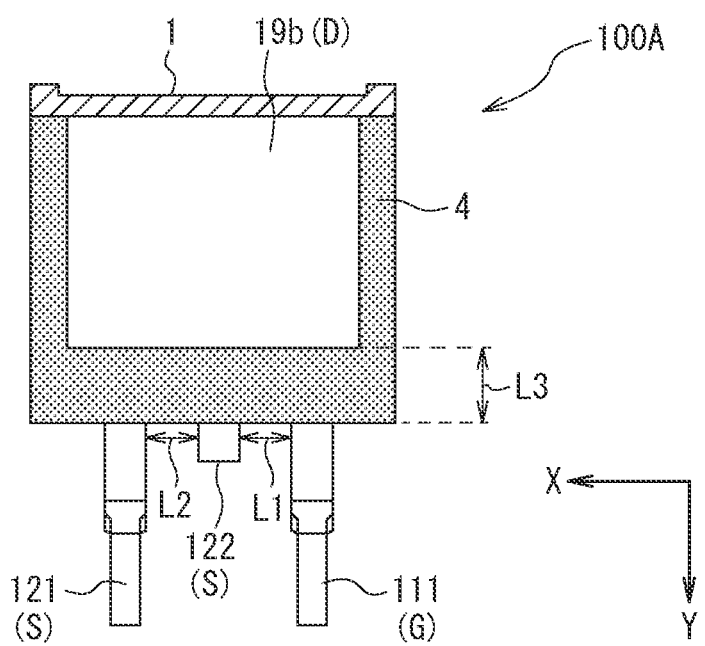
FIG. 13 is a rear view illustrating the configuration example of the semiconductor device according to Embodiment 2 or the present invention.
Figure 14:
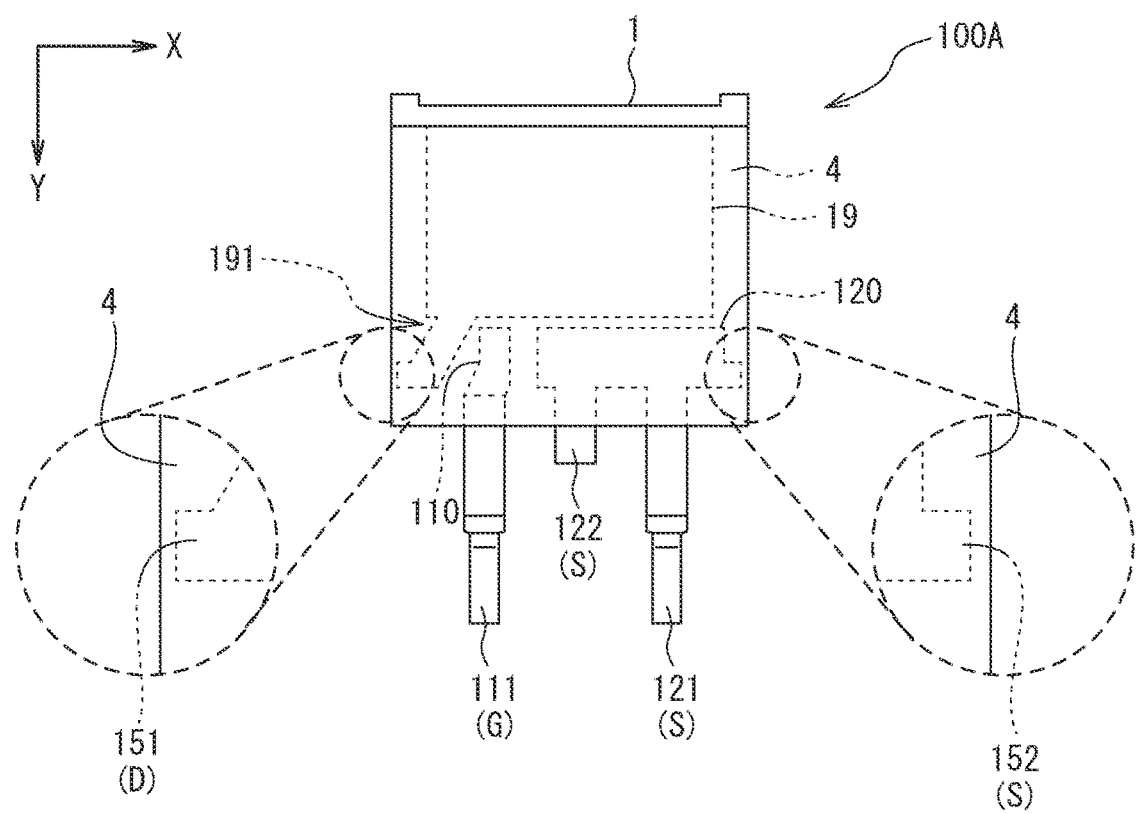
FIG. 14 is a front view illustrating a configuration example of the inside of the semiconductor device according to Embodiment 2 of the present invention.

FIG. 12 is a front view illustrating a configuration example of a semiconductor device according to Embodiment 2 of the present invention. FIG. 13 is a rear view illustrating the configuration example of the semiconductor device according to Embodiment 2 of the present invention. FIG. 14 is a front view illustrating a configuration example of the inside of the semiconductor device according to Embodiment 2 of the present invention.

As illustrated in FIGS. 12 and 14, also in a semiconductor device 100A according to Embodiment 2 of the present invention, the front surface 19a side of the die pad portion 19 on which the semiconductor chip 2 is mounted is covered and sealed with the sealing resin 4. As illustrated in FIG. 13, the rear surface 19b side of the die pad portion 19 is exposed from the sealing resin 4. Also in the semiconductor device 100A, the rear surface 19b of the die pad portion 19 functions as the drain terminal portion D. As illustrated in FIGS. 12 to 14, the first terminal portion 111, the second terminal portion 121, and the third terminal portion 122 each are exposed from the sealing resin 4. The first terminal portion 111 functions as the gate terminal portion G. The second terminal portion 121 and the third terminal portion 122 function as the source terminal portions S.

In the semiconductor device 100A, the first extension portion 151 and the second extension portion 152 are covered with the sealing resin 4. Therefore, the shortest distance L4 (see FIGS. 8 and 9) described in Embodiment 1 is not present in Embodiment 2. In Embodiment 2, the shortest distance L3 from the portion which is the rear surface 19b of the die pad portion 19 and exposed from the sealing resin 4 to the first terminal portion 111, the second terminal portion 121, or the third terminal portion 122 determines the withstand voltage of the package of the semiconductor device 100A.

Also in the semiconductor device 100A, L1, L2, and L3 may satisfy the relationships of L3>L1 and L3>L2. The distance between the drain terminal portion D and the gate terminal portion G (or the source terminal portion S) is longer than the distance between the gate terminal portion G and the source terminal portion S or the distance between the pair of source terminal portions S. Thus, the withstand voltage of the package of the semiconductor device 100A is increased.

Figure 15:
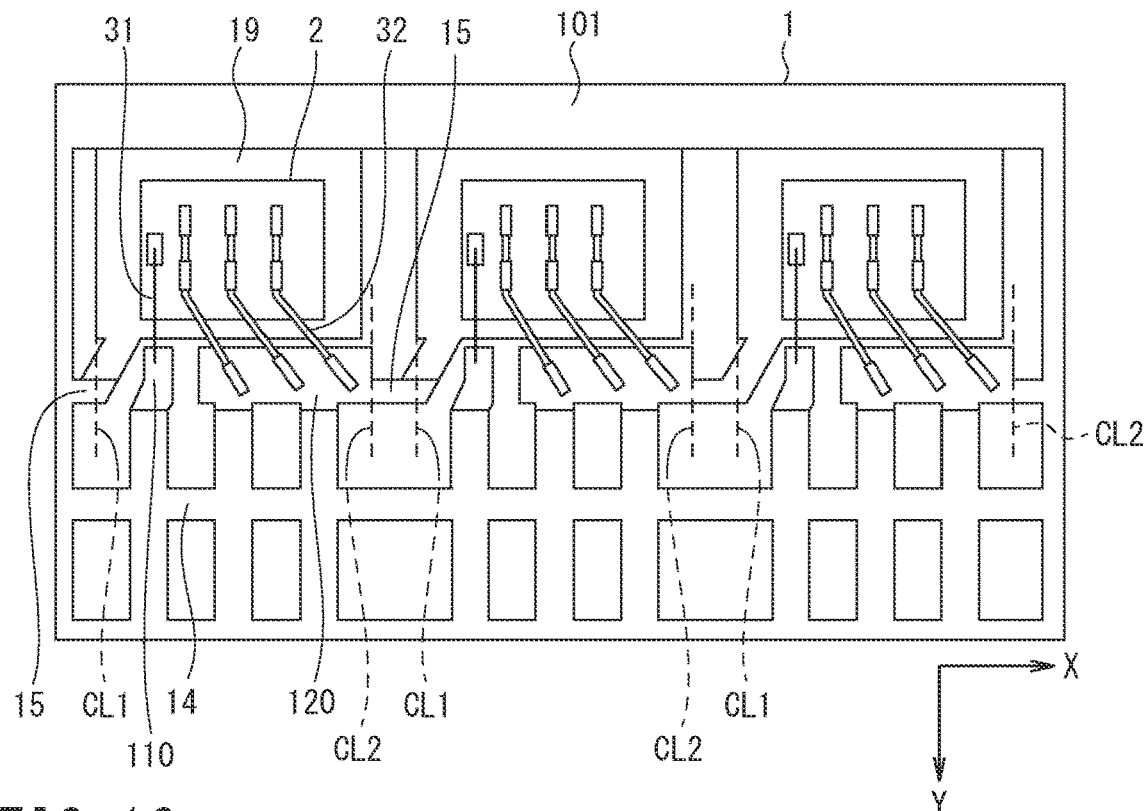
FIG. 15 is a plan view illustrating a method for manufacturing a semiconductor device according to Embodiment 2 of the present invention.
Figure 16:
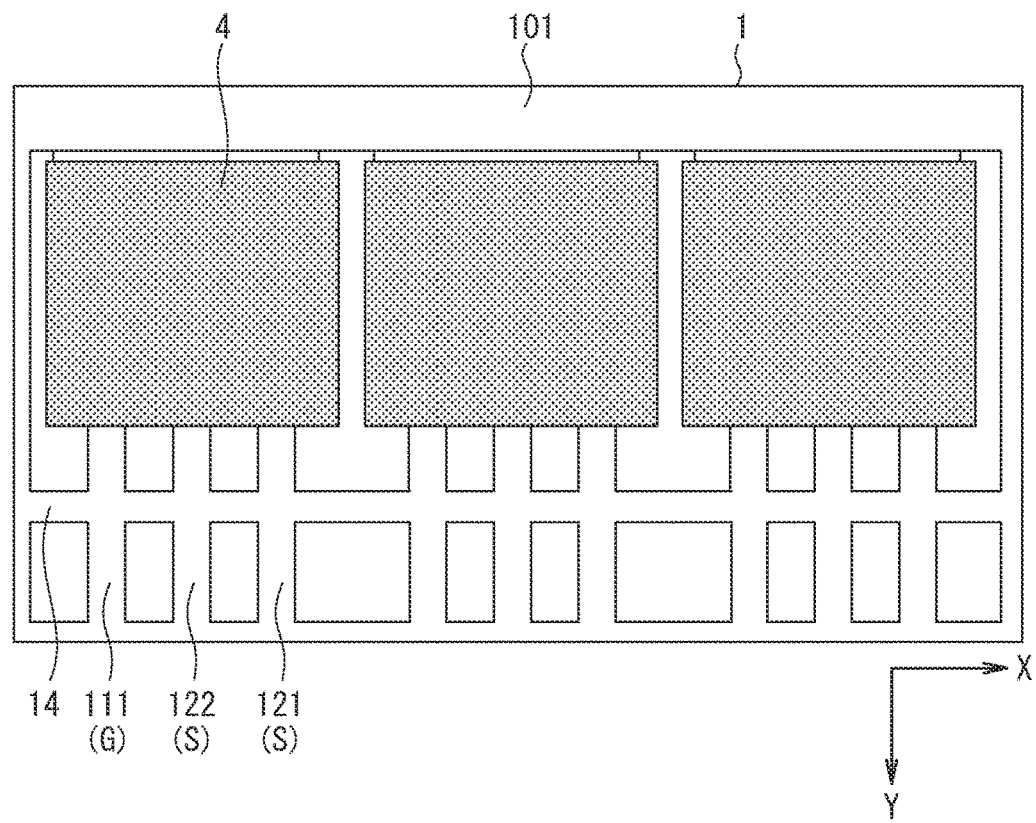
FIG. 16 is a plan view illustrating the method for manufacturing the semiconductor device according to Embodiment 2 of the present invention.

Next, a method for manufacturing the semiconductor device 100A is described. FIGS. 15 and 16 are plan views illustrating the method for manufacturing the semiconductor device according to Embodiment 2 of the present invention. The semiconductor device 100A is manufactured using various manufacturing devices, such as a die bonding device, a wire bonding device, and a molding device, for example.

In FIG. 15, processes up to the wire bonding are the same as those of the method for manufacturing the semiconductor device 100 described in Embodiment 1. More specifically, also in the method for manufacturing the semiconductor device 100A, the lead frame 1 illustrated in FIGS. 1 to 3 is prepared in the same manner as in the semiconductor device 100. In the die bonding process, the manufacturing device mounts the semiconductor chip 2 on the front surface 19a of the die pad portion 19 of the lead frame 1. Thus, the drain electrode 24 of the semiconductor chip 2 is electrically connected to the die pad portion 19. The rear surface 19b of the die pad portion 19 serves as the drain terminal portion D of the semiconductor device 100A.

Next, in the wire bonding process, the manufacturing device joins one end of the first wire 31 to the gate electrode 22 of the semiconductor chip 2 and joins the other end of the first wire 31 to the first lead post portion 110 to electrically connect the gate electrode 22 and the first lead post portion 110. Thus, the first terminal portion 111 connected to the first lead post portion 110 serves as the gate terminal portion G of the semiconductor device 100A. The manufacturing device joins one end of the second wire 32 to the source electrode 23 of the semiconductor chip 2 and joins the other end of the second wire 32 to the second lead post portion 120 to electrically connect the source electrode 23 and the second lead post portion 120. Thus, the second terminal portion 121 and the third terminal portion 122 connected to the second lead post portion 120 serve as the source terminal portions S of the semiconductor device 100A.

The method for manufacturing the semiconductor device 100A has a process of cutting the extension portion 15 before molding the sealing resin 4. In the process of cutting the extension portion 15, the manufacturing device disposes the lead frame 1 to which the first wire 31 and the second wire 32 are attached in a die. Then, the manufacturing device cuts the extension portion 15 of the lead frame 1 disposed in the die at predetermined positions CL1 and CL2. Thus, the extension portion 15 is divided into the first extension portion 151 and the second extension portion 152. In cutting the extension portion 15, it is preferable that the lead frame 1 is fixed to the die. In particular, it is preferable that the lead frame 1 is fixed to the lower die so that the die pad portion 19 and the first lead post portion 110 and the second lead post portion 120 are not displaced with respect to the die. Thus, a possibility that loose contact or disconnection occurs in the first wire 31 and the second wire 32 due to the vibration in cutting the extension portion 15 can be reduced.

The die to be used in the cutting of the extension portion 15 may be a die to be used in the molding process. Thus, the manufacturing device can start the molding process without moving the lead frame 1, from which the extension portion 15 is cut, from the die. Either one of the lower die and the upper die used in the molding process may be provided with a blade for cutting the extension portion 15. Thus, the manufacturing device can cut the extension portion 15 of the lead frame 1 with the blade provided in the lower die or the upper die while sandwiching the lead frame 1 with the lower die and the upper die so that the lead frame 1 does not move.

Next, as illustrated in FIG. 16, the manufacturing device molds the sealing resin 4 in the molding process. The manufacturing device molds the sealing resin 4 using a transfer molding technology. For example, the manufacturing device injects a molten resin into a cavity surrounded by the lower die and the upper die, and then cures the injected resin within the cavity to mold the sealing resin 4 in the state where the lead frame 1, from which the extension portion 15 is cut, is fixed in the lower die. Thus, the sealing resin 4 completely covering and sealing the first extension portion 151 and the second extension portion 152 is molded.

Next, the manufacturing device cuts out each element 10 from the lead frame 1 in the lead cutting process. In the lead cutting process, the manufacturing device cuts the connection portion 14. In the lead cutting process, the extension portion 15 is already cut and the first extension portion 151 and the second extension portion 152 are completely covered with the sealing resin 4. In the lead cutting process, the manufacturing device cuts the third terminal portion 122 to make the length in the Y-axis direction of the third terminal portion 122 shorter than the length in the Y-axis direction of the second terminal portion. Next, the manufacturing device molds the first terminal portion 111 and the second terminal portion 121 to process them into the same shape as that of an end product the forming process. Thus, the semiconductor device 100A is completed.

According to the semiconductor device 100A of Embodiment 2 of the present invention, the first terminal portion 111 serves as the gate terminal portion G, the second terminal portion 121 and the third terminal portion 122 serve as the source terminal portions S, and the rear surface 19b of the die pad portion 19 serves as the drain terminal portion D in the same manner as in the semiconductor device 100. In the X-axis direction, the gate terminal portion G and the source terminal portion S are adjacent to each other. In the Y-axis direction, the drain terminal portion D and the gate terminal portion G are adjacent to each other through the first lead post portion 110. In the Y-axis direction, the drain terminal portion D and the source terminal portion S are adjacent to each other through the second lead post portion 120. Thus, the shortest distance L3 between the drain terminal portion S and the gate terminal portion G (or the source terminal portion S) can be lengthened irrespective of the distance L1 between the gate terminal portion G and the source terminal portion S or the distance L2 between the source terminal portion S and the source terminal portion S. Thus, the semiconductor device 100A can increase the withstand voltage of the package while suppressing an increase in the outside dimension.

In the semiconductor device 100A, the first extension portion 151 is covered and sealed with the sealing resin 4. Thus, the first extension portion 151 does not influence the withstand voltage of the package of the semiconductor device 100A. The shortest distance L3 from the portion which is the rear surface 19b of the die pad portion 19 and exposed from the sealing resin 4 to the first terminal portion 111, the second terminal portion 121, or the third terminal portion 122 influences the withstand voltage of the package of the semiconductor device 100A. Moreover, for example, when two or more of the semiconductor devices 100A are mounted to be adjacent to each other, the first extension portion 151 of one semiconductor device 100A can be prevented from contacting the other semiconductor device 100A adjacent thereto. Thus, the semiconductor devices 100A can be prevented from influencing each other through the first extension portion 151.

Moreover, in the semiconductor device 100A, the second extension portion 152 is covered and sealed with the sealing resin. Thus, when two or more of the semiconductor devices 100A are mounted to be adjacent to each other, the second extension portion 152 of one semiconductor device 100A can be prevented from contacting the other semiconductor device 100A adjacent thereto. Thus, the semiconductor devices 100A can be prevented from influencing each other through the second extension portion 152.

The method for manufacturing the semiconductor device 100A further includes a process of cutting the extension portion 15 before the process of covering and sealing the semiconductor chip 2, the first lead post portion 110, the second lead post portion 120, the first wire 31, and the second wire 32 with the sealing resin 4. Thus, the first extension portion 151 and the second extension portion 152 can be completely covered with the sealing resin 4.

Other Embodiments

As described above, the present invention is described by means of the embodiments. However, it should not be understood that the description and the drawings forming part of this disclosure limit the present invention. Various alternative embodiments and modifications will be made apparent to a person skilled in the art by this disclosure.

For example, although the embodiments above describe that the semiconductor chip 2 is a power MOSFET, the semiconductor chip 2 may be an IGBT (insulated gate bipolar transistor). In the case of the IGBT, the drain may be read as a collector and the source may be read as an emitter.

The gate insulating film of the semiconductor chip 2 is not limited to the silicon oxide film ($SiO_2$ film) and may be another insulating film. For the gate insulating film, a silicon oxynitride (SiON) film, a strontium oxide (SrO) film, a silicon nitride ($Si_3N_4$) film, and an aluminum oxide ($Al_2O_3$) film are also usable. Moreover, a composite membrane in which some single-layer insulating films are laminated and the like are also usable for the gate insulating film. A MOSFET using an insulating film other than the $SiO_2$ film as the gate insulating film may also be referred to as a MIS (metal insulator semiconductor) FET. The MISFET means a more comprehensive insulated gate transistor including the MOSFET.

DESCRIPTION OF SYMBOLS 1, 301 lead frame
2, 302 semiconductor chip 2a, 4a, 19a, 21a front surface
2b, 4b, 21b rear surface
4, 304 sealing resin
4c outer edge portion
10, 10A, 10B, 10C, 310, 310A, 310B, 310C element
11 first lead portion
12 second lead portion
14 connection portion
15 extension portion
19, 319 die pad portion
19b rear surface (drain terminal portion D)
19L1, 19L2, 19L3, 19L4 side
21 base material
22 gate electrode
23 source electrode
24 drain electrode
25 protective film
31, 331 first wire
32, 332 second wire
100, 100A, 300 semiconductor device
101, 330 frame body
109 die pad portion
110 first lead post portion
111 first terminal portion (gate terminal portion G)
120 second lead post portion
120L1, 120L2 outer edge portion
121 second terminal portion (source terminal portion S)
122 third terminal portion (source terminal portion S)
151 first extension portion
152 second extension portion
191 corner portion neighborhood
311 terminal portion (gate terminal portion G)
312 terminal portion (drain terminal portion D)
313 terminal portion (source terminal portion S)
314 first lead post portion
315 second lead post portion
316 support portion
319 die pad portion
330 frame body
L1, L2, L11, L12 distance
L3, L4 shortest distance
L5 shortest distance

What is claimed is:

1. A lead frame comprising:
a die pad portion having a front surface;
a first lead portion disposed apart from the die pad portion and extending in a first direction parallel to the front surface of the die pad portion;
a second lead portion disposed apart from the die pad portion and the first lead portion and extending in the first direction; and
an extension portion extending from a corner portion neighborhood of the die pad portion to an outside of the die pad portion in a direction parallel to the front surface of the die pad portion, wherein
the first lead portion has
a first terminal portion, and
a first lead post portion positioned on a side closer to the die pad portion relative to the first terminal portion and electrically connected to the first terminal portion,
the second lead portion has
a second terminal portion,
a third terminal portion positioned between the first terminal portion and the second terminal portion, and
a second lead post portion positioned on a side closer to the die pad portion relative to the second terminal portion and the third terminal portion and electrically connected to the second terminal portion and the third terminal portion,
the first lead post portion, the second lead post portion, and the extension portion being arranged in a second direction parallel to the front surface of the die pad portion,
the second direction crossing the first direction,
the second lead post portion further including one outer edge portion adjacent to the first lead post portion, another outer edge portion positioned on a side opposite to the one outer edge portion, and a second extension portion extending from the another outer edge portion to an outside of the second lead post portion in the second direction, and
the first lead post portion, the second lead post portion, the first extension portion, and the second extension portion being arranged in the second direction.

2. The lead frame according to claim 1, wherein
the lead frame contains a first element and a second element adjacent to each other along the second direction,
the first element and the second element each include
the die pad portion, the first lead portion, the second lead portion, and the extension portion, and
the extension portion of the first element is connected to the second lead post portion of the second element.

3. A semiconductor device comprising:
a lead frame; and
a semiconductor chip having a first surface and a second surface positioned on a side opposite to the first surface, having a first electrode and a second electrode on a side of the first surface, and having a third electrode on a side of the second surface, wherein
the lead frame includes
a die pad portion having a front surface and electrically connected to the third electrode by attachment of the semiconductor chip to a side of the front surface,
a first lead portion disposed apart from the die pad portion and extending in a first direction parallel to the front surface of the die pad portion,
a second lead portion disposed apart from the die pad portion and the first lead portion and extending in the first direction, and
a first extension portion extending from a corner portion neighborhood of the die pad portion to an outside of the die pad portion in a direction parallel to the front surface of the die pad portion,
the first lead portion has
a first terminal portion, and
a first lead post portion positioned on a side closer to the die pad portion relative to the first terminal portion and electrically connected to the first terminal portion,
the second lead portion has
a second terminal portion,
a third terminal portion positioned between the first terminal portion and the second terminal portion, and
a second lead post portion positioned on a side closer to the die pad portion relative to the second terminal portion and the third terminal portion and electrically connected to the second terminal portion and the third terminal portion,
the first lead post portion, the second lead post portion, and the first extension portion are arranged in a second direction parallel to the front surface of the die pad portion, the second direction crosses the first direction, the second lead post portion further including one outer edge portion adjacent to the first lead post portion, another outer edge portion positioned on a side opposite to the one outer edge portion, and a second extension portion extending from the another outer edge portion to an outside of the second lead post portion in the second direction, and the first lead post portion, the second lead post portion, the first extension portion, and the second extension portion being arranged in the second direction.

4. The semiconductor device according to claim 3 further comprising:
a first wire electrically connecting the first electrode and the first lead post portion;
a second wire electrically connecting the second electrode and the second lead post portion; and
a sealing resin covering and sealing the semiconductor chip, the first lead post portion, the second lead post portion, the first wire, and the second wire, wherein
another surface positioned on a side opposite to one surface of the die pad portion is exposed from the sealing resin.

5. The semiconductor device according to claim 4, wherein
when a distance between the first terminal portion and the third terminal portion is defined as L1,
a distance between the second terminal portion and the third terminal portion is defined as L2, and
a shortest distance from a portion which is the another surface of the die pad portion and exposed from the sealing resin to the first terminal portion, the second terminal portion, or the third terminal portion is defined as L3,
L3>L1 and L3>L2 are established.

6. The semiconductor device according to claim 5, wherein
the first extension portion is covered and sealed with the sealing resin.

7. The semiconductor device according to claim 5, wherein
the first extension portion is exposed from the sealing resin, and
when a distance between the first terminal portion and the third terminal portion is defined as L1,
a distance between the second terminal portion and the third terminal portion is defined as L2, and
a shortest distance which is a distance along an outer edge portion of the sealing resin from the first extension portion to the first terminal portion is defined as L4,
L4>L1 and L4>L2 are established.

8. The semiconductor device according to claim 4, wherein
the first extension portion is covered and sealed with the sealing resin.

9. The semiconductor device according to claim 4, wherein
the first extension portion is exposed from the sealing resin, and
when a distance between the first terminal portion and the third terminal portion is defined as L1,
a distance between the second terminal portion and the third terminal portion is defined as L2, and
a shortest distance which is a distance along an outer edge portion of the sealing resin from the first extension portion to the first terminal portion is defined as L4,
L4>L1 and L4>L2 are established.

10. The semiconductor device according to claim 3, wherein
an end surface of the first extension portion and an end surface of the second extension portion are symmetrically disposed to each other with respect to an arbitrary plane orthogonal to the front surface of the die pad portion.

11. The semiconductor device according to claim 3, wherein
the second extension portion is covered and sealed with the sealing resin.

12. The semiconductor device according to claim 3, wherein
the second extension portion is exposed from the sealing resin, and
when a distance between the first terminal portion and the third terminal portion is defined as L1,
a distance between the second terminal portion and the third terminal portion is defined as L2, and
a shortest distance which is a distance along an outer edge portion of the sealing resin from the second extension portion to the second terminal portion or the third terminal portion is defined as L5,
L5>L1 and L5>L2 are established.

13. A method for manufacturing a semiconductor device comprising:
preparing a lead frame,
the lead frame having a die pad portion having a front surface,
a first lead portion disposed apart from the die pad portion and extending in a first direction parallel to the front surface of the die pad portion,
a second lead portion disposed apart from the die pad portion and the first lead portion and extending in the first direction, and
an extension portion extending from a corner portion neighborhood of the die pad portion to an outside of the die pad portion in a direction parallel to the front surface of the die pad portion,
the first lead portion having
a first terminal portion, and
a first lead post portion positioned on a side closer to the die pad portion relative to the first terminal portion and electrically connected to the first terminal portion,
the second lead portion having
a second terminal portion,
a third terminal portion positioned between the first terminal portion and the second terminal portion, and
a second lead post portion positioned on a side closer to the die pad portion relative to the second terminal portion and the third terminal portion and electrically connected to the second terminal portion and the third terminal portion,
the first lead post portion, the second lead post portion, and the extension portion being arranged in a second direction parallel to the front surface of the die pad portion, and the second direction crossing the first direction;
the second lead post portion further including one outer edge portion adjacent to the first lead post portion, another outer edge portion positioned on a side opposite to the one outer edge portion, and a second extension portion extending from the another outer edge portion to an outside of the second lead post portion in the second direction, and the first lead post portion, the second lead post portion, the first extension portion, and the second extension portion being arranged in the second direction preparing a semiconductor chip having a first electrode and a second electrode on a side of a first surface and having a third electrode on a side of a second surface positioned on a side opposite to the first surface;

attaching the side of the second surface of the semiconductor chip to a side of the front surface of the die pad portion to electrically connect the third electrode and the die pad portion;

electrically connecting the first electrode and the first lead post portion using a first wire;

electrically connecting the second electrode and the second lead post portion using a second wire; and covering and sealing the semiconductor chip, the first lead post portion, the second lead post portion, the first wire, and the second wire with a sealing resin, wherein in the sealing, the side of the front surface of the die pad portion is covered with the sealing resin and a rear surface positioned on a side opposite to the front surface of the die pad portion is exposed from the sealing resin.

14. The method for manufacturing a semiconductor device according to claim 13 further comprising:

after the sealing, cutting a portion which is the extension portion and exposed from the sealing resin.

15. The method for manufacturing a semiconductor device according to claim 13 further comprising:

before the sealing, cutting the extension portion, wherein in the sealing, a portion left on a side of the die pad portion of the extension portion is covered with the sealing resin.

16. The method for manufacturing a semiconductor device according to claim 13, wherein the lead frame contains a first element and a second element adjacent to each other along the second direction, the first element and the second element each include the die pad portion, the first lead portion, the second lead portion, and the extension portion, and the extension portion of the first element is connected to the second lead post portion of the second element.

* * * * *